US010957699B2

(12) United States Patent
Ito

(10) Patent No.: US 10,957,699 B2
(45) Date of Patent: Mar. 23, 2021

(54) INTEGRATED ASSEMBLIES WHICH INCLUDE TWO DIFFERENT TYPES OF SILICON NITRIDE, AND METHODS OF FORMING INTEGRATED ASSEMBLIES

(71) Applicant: Micron Technology, inc., Boise, ID (US)

(72) Inventor: Satomi Ito, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/378,075

(22) Filed: Apr. 8, 2019

(65) Prior Publication Data

US 2020/0321341 A1    Oct. 8, 2020

(51) Int. Cl.
*H01L 21/70* (2006.01)
*H01L 21/44* (2006.01)
*H01L 27/108* (2006.01)

(52) U.S. Cl.
CPC .. *H01L 27/10885* (2013.01); *H01L 27/10805* (2013.01); *H01L 27/10888* (2013.01); *H01L 27/10897* (2013.01)

(58) Field of Classification Search
CPC .............. H01L 27/10885; H01L 27/10888
USPC ......................................... 438/599; 257/499
See application file for complete search history.

(56) References Cited

U.S. PATENT DOCUMENTS

| 7,470,586 | B2 * | 12/2008 | Bae | H01L 27/10814 438/250 |
| 8,039,896 | B2 * | 10/2011 | Seo | H01L 27/0207 257/331 |
| 9,947,669 | B1 * | 4/2018 | Takesako | H01L 27/10888 |
| 10,249,628 | B2 * | 4/2019 | Cho | H01L 29/423 |
| 10,468,350 | B2 * | 11/2019 | Kim | H01L 27/10855 |
| 10,573,653 | B2 * | 2/2020 | Kim | H01L 27/10823 |

* cited by examiner

*Primary Examiner* — Calvin Lee
(74) *Attorney, Agent, or Firm* — Wells St. John P.S.

(57) ABSTRACT

Some embodiments include an integrated assembly which has bitline structures that extend along a first direction. The bitline structures include conductive bitlines, and include insulative shells which extend over the conductive bitlines and along sidewalls of the conductive bitlines. The insulative shells include a first silicon nitride composition. The bitline structures are spaced from one another by intervening regions. Semiconductor structures and insulative spacers are within the intervening regions. The semiconductor structures and insulative spacers alternate with one another along the first direction. The insulative spacers include a second silicon nitride composition which is characterized as having a faster etch rate than the first silicon nitride composition by a mixture which contains sulfuric acid and hydrogen peroxide. Some embodiments include methods of forming integrated assemblies.

31 Claims, 33 Drawing Sheets

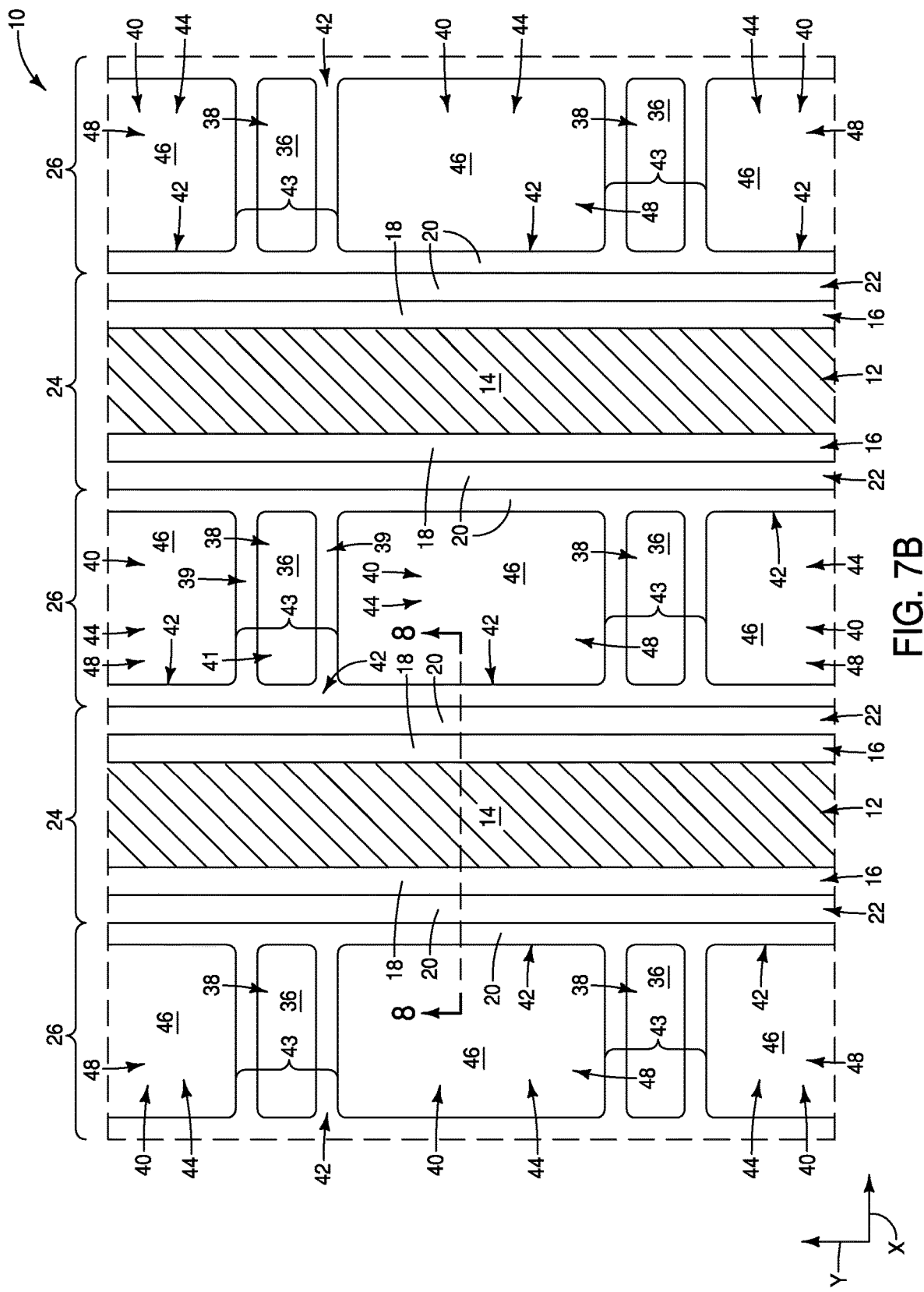

INTEGRATED ASSEMBLIES WHICH INCLUDE TWO DIFFERENT TYPES OF SILICON NITRIDE, AND METHODS OF FORMING INTEGRATED ASSEMBLIES

TECHNICAL FIELD

Integrated assemblies which include two different types of silicon nitride, and methods of forming integrated assemblies.

BACKGROUND

Dynamic random-access memory (DRAM) is one type of integrated memory. Individual DRAM cells may comprise access transistors electrically coupled with capacitors. The capacitors may be formed over conductive contact regions, and may be coupled to source/drain regions of the access transistors through the conductive contact regions. Neighboring conductive contact regions may be electrically isolated from one another by insulative spacers provided between them.

Increasing levels of integration may lead to tighter packing of integrated components, and accordingly to less room for the conductive contact regions. It would be desirable to develop methods which enable the insulative spacers to be shrunk in order to provide more room for the conductive contact regions. It would also be desirable to develop architectures having new arrangements of spacers and conductive contact regions.

BRIEF DESCRIPTION OF THE DRAWINGS

FIGS. 7A and 7B are diagrammatic cross-sectional top-down views along the lines A-A and B-B, respectively, of FIG. 1 at an example process stage which may follow that of FIGS. 6A and 6B.

DETAILED DESCRIPTION OF THE ILLUSTRATED EMBODIMENTS

Some embodiments include arrangements of contact regions (e.g., semiconductor structures), insulative spacers and insulative shells; with the insulative shells being along conductive lines (e.g., bitlines). The insulative spacers comprise a different type of silicon nitride than the insulative shells, which may enable regions of the insulative spacers to be selectively removed relative to the insulative shells. Accordingly, the insulative spacers may be reduced in size, which may enable more room to be available for the contact regions. The arrangements may be incorporated into memory arrays (e.g., DRAM arrays). Some embodiments include methods in which a first type of silicon nitride is selectively removed relative to a second type of silicon nitride using a piranha solution (i.e., a mixture comprising sulfuric acid and hydrogen peroxide). Example embodiments are described with reference to FIGS. 1-18.

Figure 1:
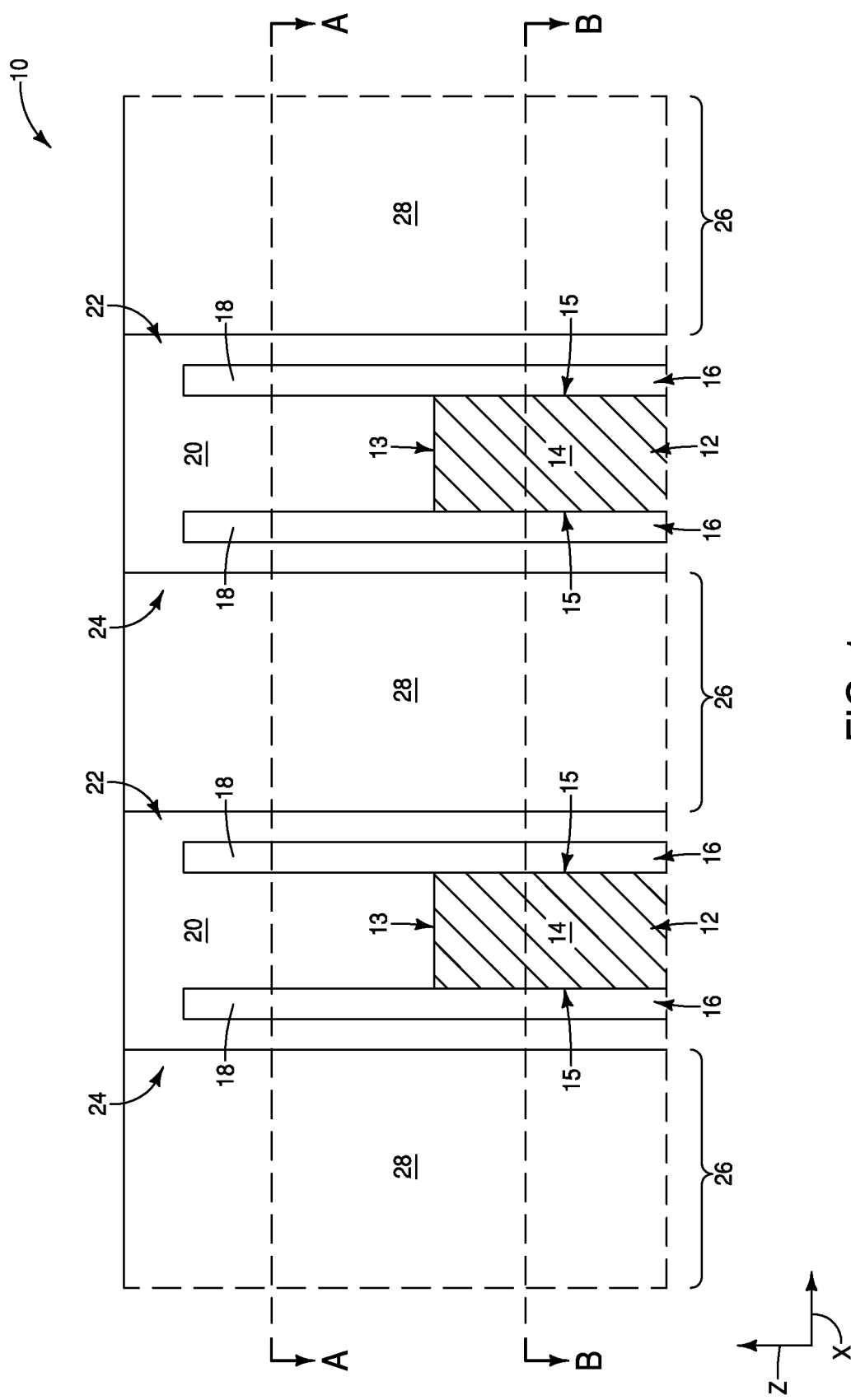
FIG. 1 is a diagrammatic cross-sectional side view of an integrated assembly.

Referring to FIG. 1, a region of an integrated assembly (construction) 10 is shown in cross-sectional side view. The assembly includes a memory cell area in which a pair of bitlines 12 extend in and out of the page relative to the cross-sectional view of FIG. 1. Although not shown, the assembly further includes a peripheral circuit area in which an access circuit is configured to access the memory cell array area.

The bitlines 12 comprise conductive bitline material 14. The bitline material 14 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the bitline material 14 may comprise tungsten.

The bitlines 12 have top surfaces 13 and sidewall surfaces 15.

Insulative spacers 16 are along the sidewall surfaces 15 of the bitlines 12. The spacers 16 comprise insulative material 18. The insulative material 18 may comprise any suitable composition(s); and in some embodiments may comprise, consist essentially of, or consist of silicon dioxide.

In the illustrated embodiment, the insulative spacers 16 extend to above the upper surfaces 13 of the bitlines 12. In other embodiments, the insulative spacers may have upper surfaces at about the same level as the upper surfaces 13 of the bitlines 12.

Insulative material 20 extends around the bitlines 12. The insulative material 20 may be considered to form insulative shells 22 which extend over the bitlines 12 and along the sidewalls 15 of the bitlines 12. In the shown embodiment, the insulative material 20 of the insulative shells 22 is spaced from the sidewalls 15 of the bitlines 12 by the insulative spacers 16.

The insulative material 20 of the insulative shells 22 comprises silicon nitride; and in some embodiments may be considered to comprise a first silicon nitride composition. The first silicon nitride composition 20 may comprise, consist essentially of, or consist of silicon nitride.

The bitlines 12, spacers 16, and insulative shells 22 may be together considered to be bitline structures 24. The bitline structures 24 may be considered to comprise the bitlines 12, to comprise the insulative materials 18 and 20 protecting the sidewall surfaces 15 of the bitlines, and to comprise the insulative material 20 protecting the upper surfaces 13 of the bitlines.

The bitline structures 24 extend in and out of the page relative to the cross-sectional view of FIG. 1. The bitline structures are laterally spaced from one another by intervening regions 26. A material 28 is within the intervening regions 26. The material 28 may comprise any suitable composition(s); and in some embodiments may comprise, consist essentially of, or consist of silicon dioxide (or silicon oxide). In some embodiments, the material 28 may comprise silicon dioxide formed by a spin-on process.

An axis system is provided adjacent the assembly 10 of FIG. 1. The axis system includes a vertical z-axis and horizontal x-axis. The bitline structures 24 extend vertically along the z-axis, and are spaced from another by the intervening regions 26 along the x-axis.

The bitline structures 24 and insulative material 28 of FIG. 1 may be supported by a semiconductor substrate (not shown). The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the semiconductor substrate may comprise monocrystalline silicon.

Figure 2A:
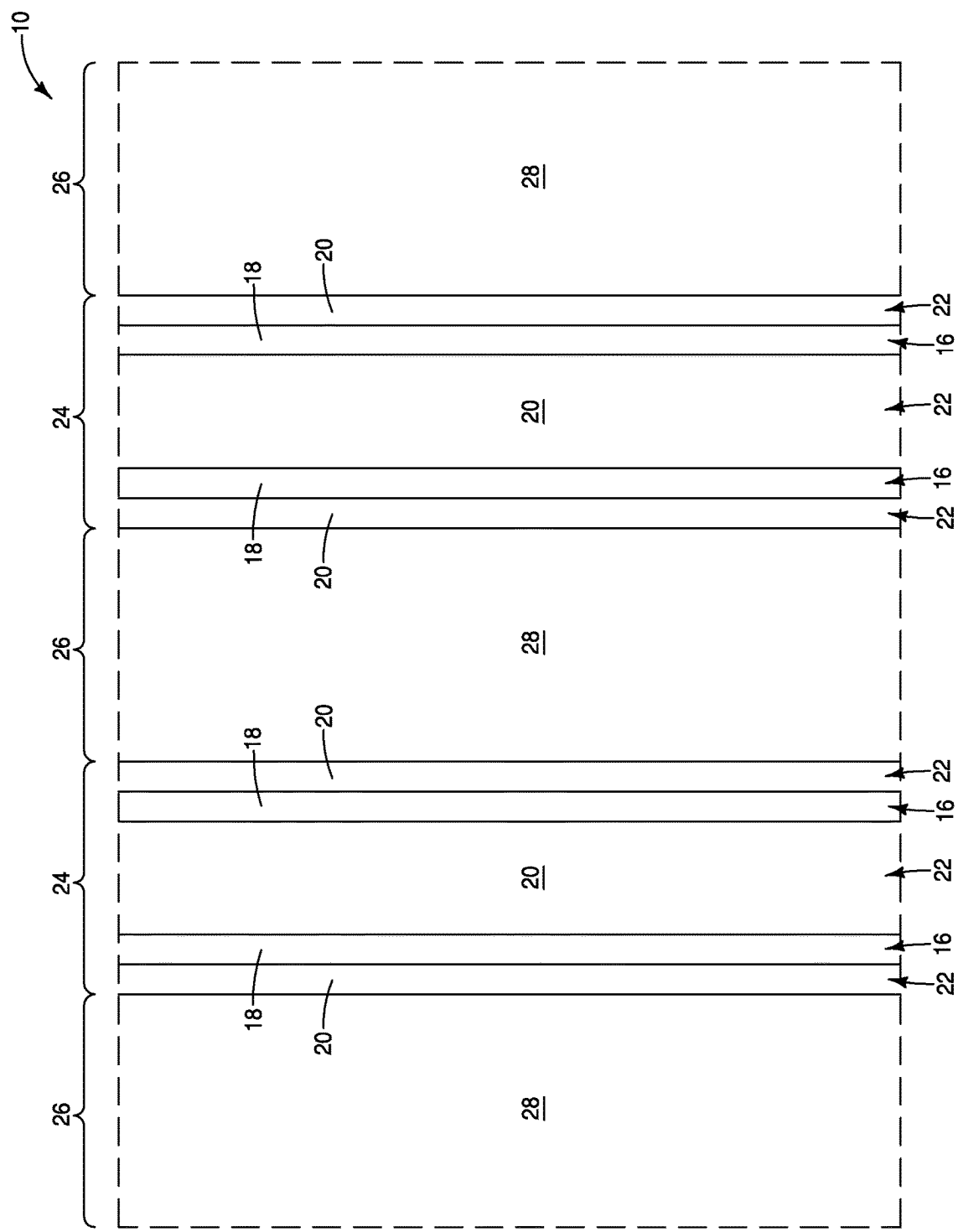
FIGS. 2A and 2B are diagrammatic cross-sectional top-down views along the lines A-A and B-B, respectively, of FIG. 1 at an example process stage of an example method for forming an example integrated assembly.
Figure 2B:
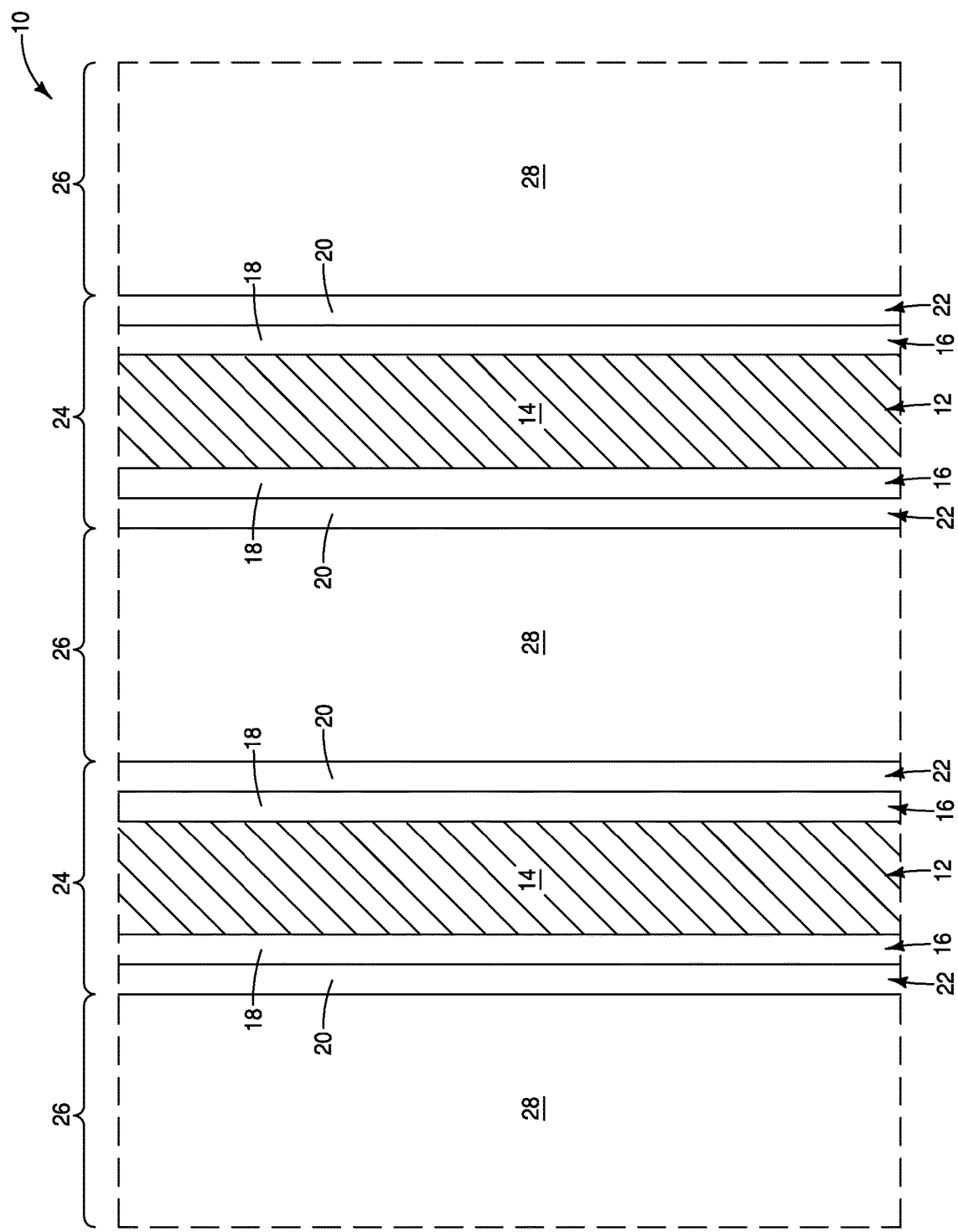

FIGS. 2A and 2B show top-down cross-sectional views along the lines A-A and B-B, respectively, of FIG. 1. An axis system is provided adjacent the assembly 10 of FIGS. 2A and 2B; with such axis system including the x-axis, and including a y-axis extending orthogonally relative to the x-axis. The bitline structures 24 extend along the direction of the y-axis. In some embodiments, the y-axis direction may be referred to as a first direction.

In some embodiments, the structures 24 may be considered to be examples of linear structures extending primarily along the first direction of the y-axis. Such linear structures comprise the insulative shells 22 over the conductive lines 12. Although the structures 24 are referred to as being "linear" structures, it is to be understood that such structures may be curved, wavy, etc., in some embodiments.

In some embodiments, FIGS. 2A and 2B may be considered to illustrate an initial process stage of an example method for forming conductive contact regions between the bitline structures 24.

Figure 3A:
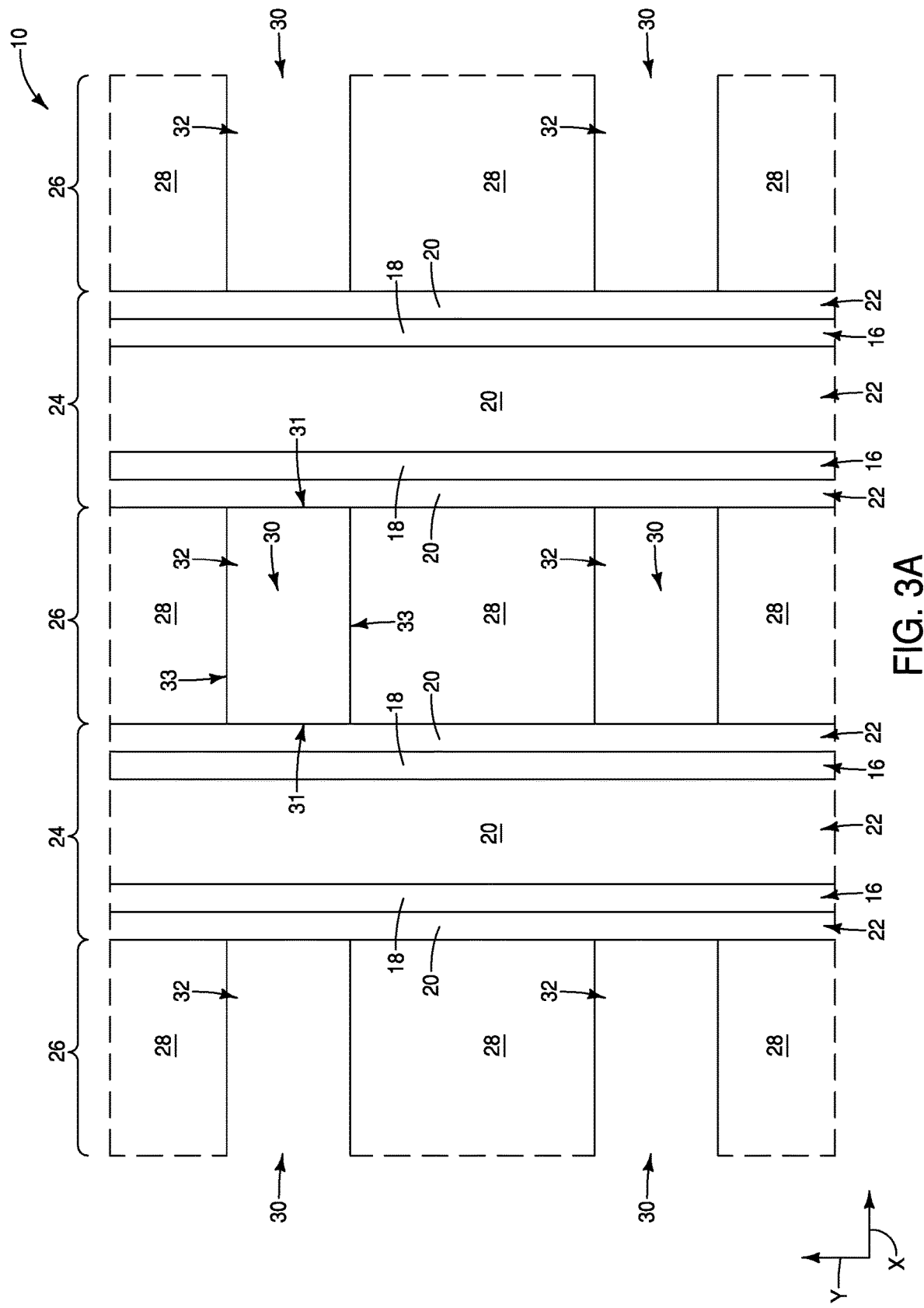
FIGS. 3A and 3B are diagrammatic cross-sectional top-down views along the lines A-A and B-B, respectively, of FIG. 1 at an example process stage which may follow that of FIGS. 2A and 2B.
Figure 3B:
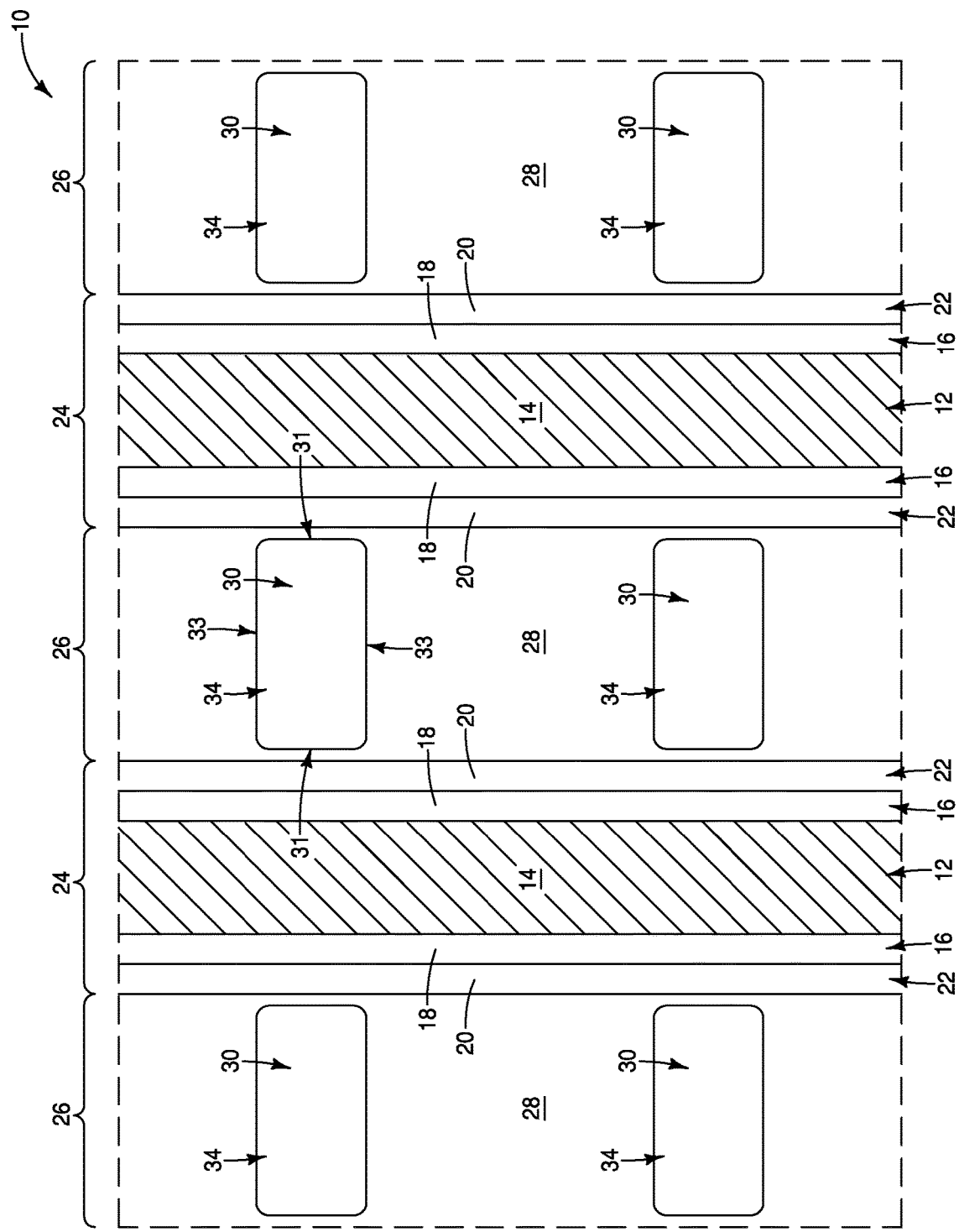

Referring to FIGS. 3A and 3B, first openings 30 are formed to extend into the silicon dioxide 28 of the intervening regions 26. The openings 30 taper from wide upper regions 32 (shown along the cross-section of FIG. 3A) to narrow lower regions 34 (shown along the cross-section of FIG. 3B). The openings 30 are elongated along the direction of the x-axis. In some embodiments, the x-axis may be considered to correspond to a second direction which is orthogonal to the first direction of the y-axis. In the shown embodiment, the bitline structures 24 extend along the first direction of the y-axis, and the openings 30 are elongated along the second direction of the x-axis. The openings 30 are specifically illustrated to be elongated along a second direction which is orthogonal to the first direction along which the bitline structures 24 extend. In some embodiments, the second direction may be considered to be substantially orthogonal to the first direction; with the term "substantially orthogonal" meaning orthogonal to within reasonable tolerances of fabrication and measurement. In some embodiments, the second direction along which the openings 30 are elongated may be considered to cross the first direction along which the bitline structures 24 extend, and may or may not be substantially orthogonal to such first direction.

The openings 30 may be patterned with any suitable processing. For instance, in some embodiments a photoresist mask (not shown) may be provided to define locations of the openings 30, and then the openings 30 may be formed with one or more suitable etches. The illustrated taper of the openings 30 from the wide upper regions 32 to the narrow lower regions 34 may result from inherent limitations of etching processes in that the etching processes may remove material slower from the bottom regions of the openings than from the top regions of the openings. In some embodiments (not shown), the lower regions of the openings 30 may have about the same widths as the top regions of such openings (i.e., the illustrated taper of the openings 30 may be eliminated).

The openings 30 may be formed with any suitable etching; and in some embodiments may be formed with a dry etch of the silicon dioxide 28.

In the illustrated embodiment, each of the openings 30 has a pair of opposing long edges 33, and a pair of opposing short edges 31. The long edges 33 extend along the x-axis direction, and the short edges 31 extend along the y-axis direction. The long edges 33 and short edges 31 are shorter along the cross-section of FIG. 3B than along the cross-section of FIG. 3A due to the illustrated tapering (narrowing) of the openings in proceeding from the upper region of FIG. 3A to the lower region of FIG. 3B.

Figure 4A:
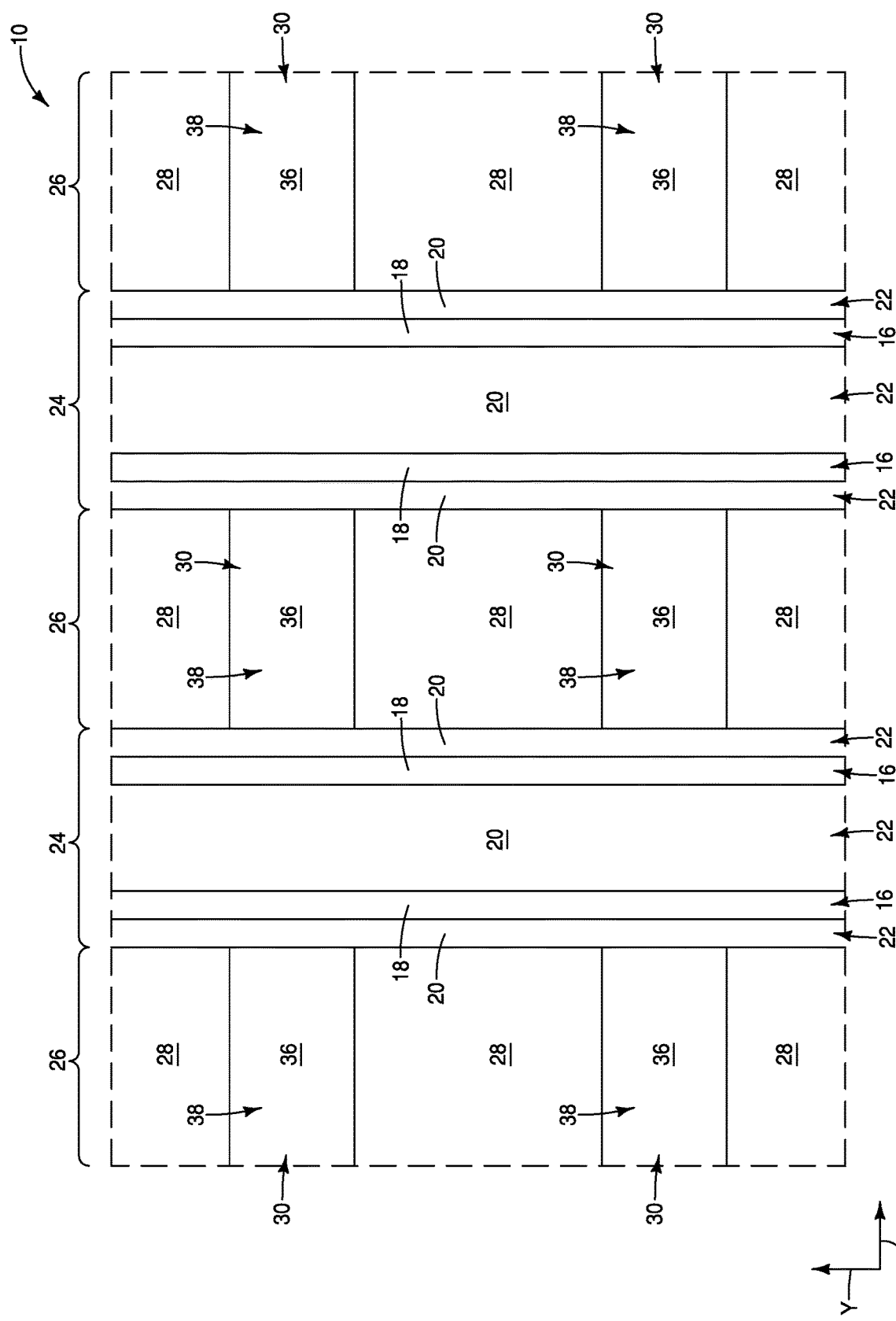
FIGS. 4A and 4B are diagrammatic cross-sectional top-down views along the lines A-A and B-B, respectively, of FIG. 1 at an example process stage which may follow that of FIGS. 3A and 3B.
Figure 4B:
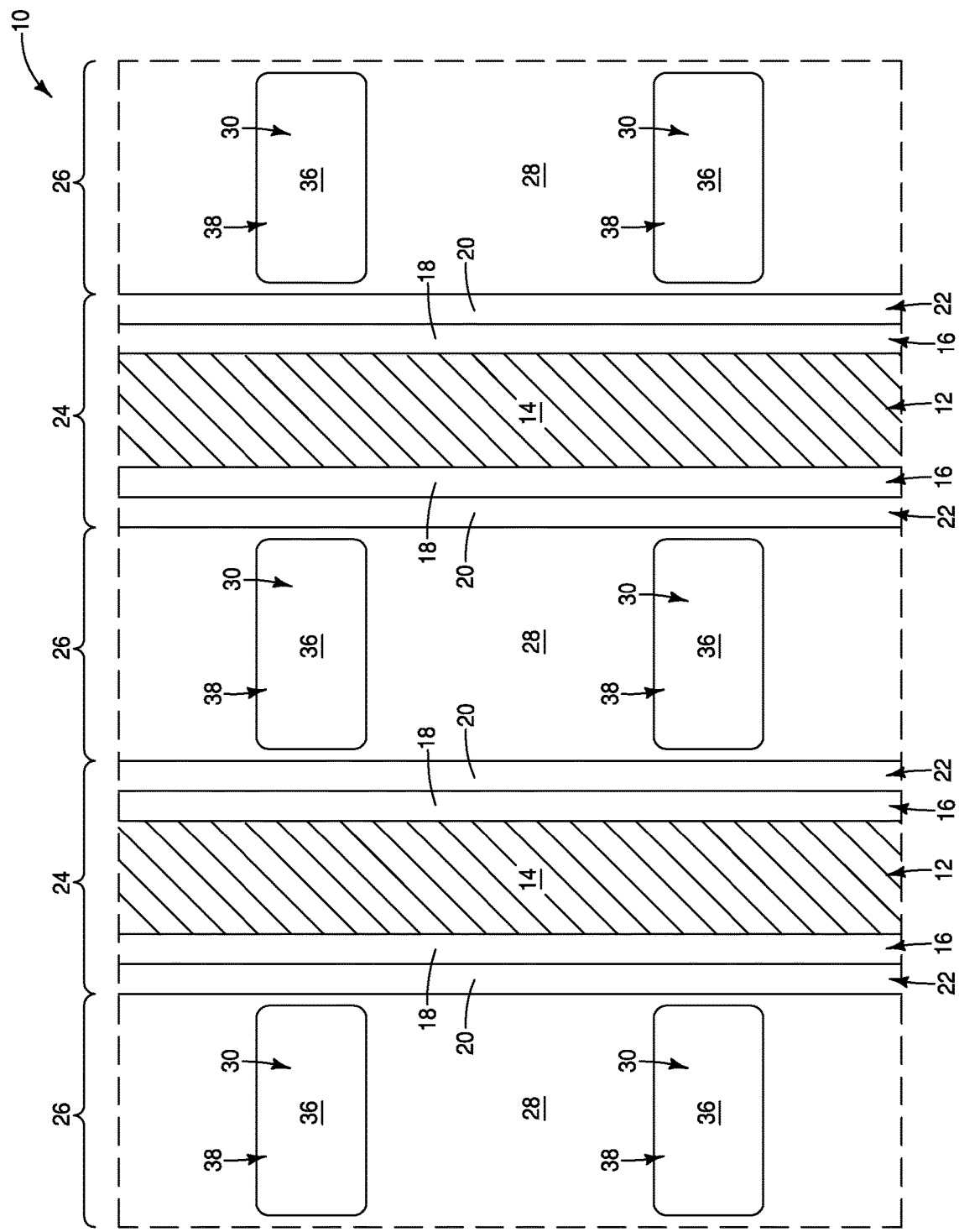

Referring to FIGS. 4A and 4B, after the photoresist mask (not shown) for defining locations of the openings 30 is removed, a second silicon nitride composition 36 is formed within the openings 30. The second silicon nitride composition 36 is different from the first silicon nitride composition 20, and specifically is configured to be more rapidly etched by a piranha solution (i.e., a solution comprising sulfuric acid and hydrogen peroxide) than the silicon nitride composition 20. In some embodiments, the silicon nitride composition 36 may comprise silicon, nitrogen and boron; while the silicon nitride composition 20 consists of, or consists essentially of silicon and nitrogen. The concentration of boron within the silicon nitride composition 36 may be within a range of from about 20 atomic percent to about 30 atomic percent. In some embodiments, the silicon nitride composition 36 may comprise a lower density than the silicon nitride composition 20. For instance, the silicon nitride composition 20 may be deposited at a temperature of at least about 600° C. (e.g., a temperature within a range of from about 600° C. to about 650° C.), and the silicon nitride composition 36 may be deposited at a temperature of no greater than about 500° C. The different deposition temperatures may lead to the silicon nitride composition 36 having lower density than the silicon nitride composition 20. The reference to the silicon nitride compositions as being "deposited at" specific temperatures means that the precursors utilized for the depositions are at the specified temperatures during the depositions. A substrate may also be maintained at the specified temperatures as the silicon nitride compositions are deposited along surfaces of the substrate.

The second silicon nitride composition 36 within the openings 30 is configured as silicon nitride plugs 38.

Figure 5A:
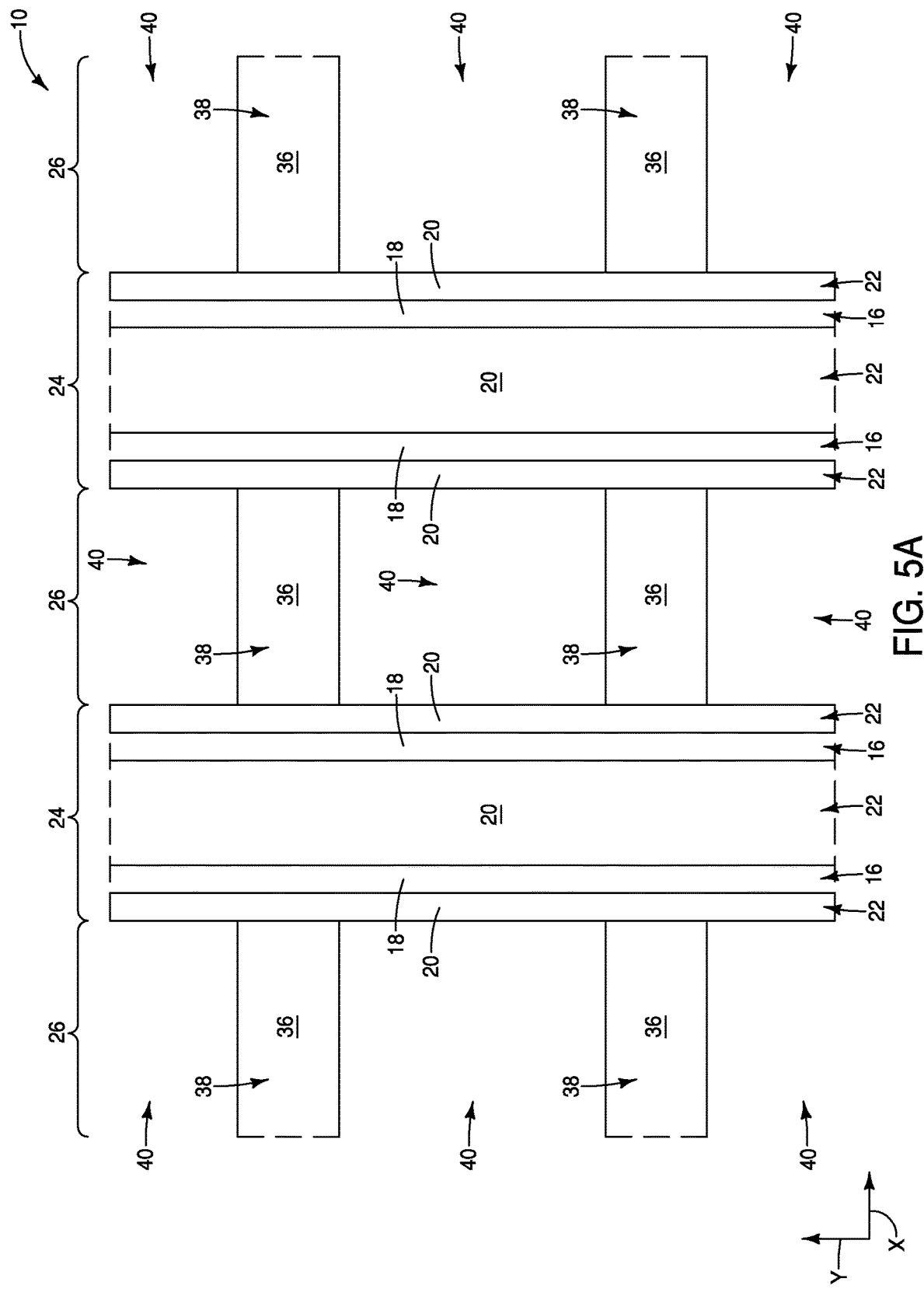
FIGS. 5A and 5B are diagrammatic cross-sectional top-down views along the lines A-A and B-B, respectively, of FIG. 1 at an example process stage which may follow that of FIGS. 4A and 4B.
Figure 5B:
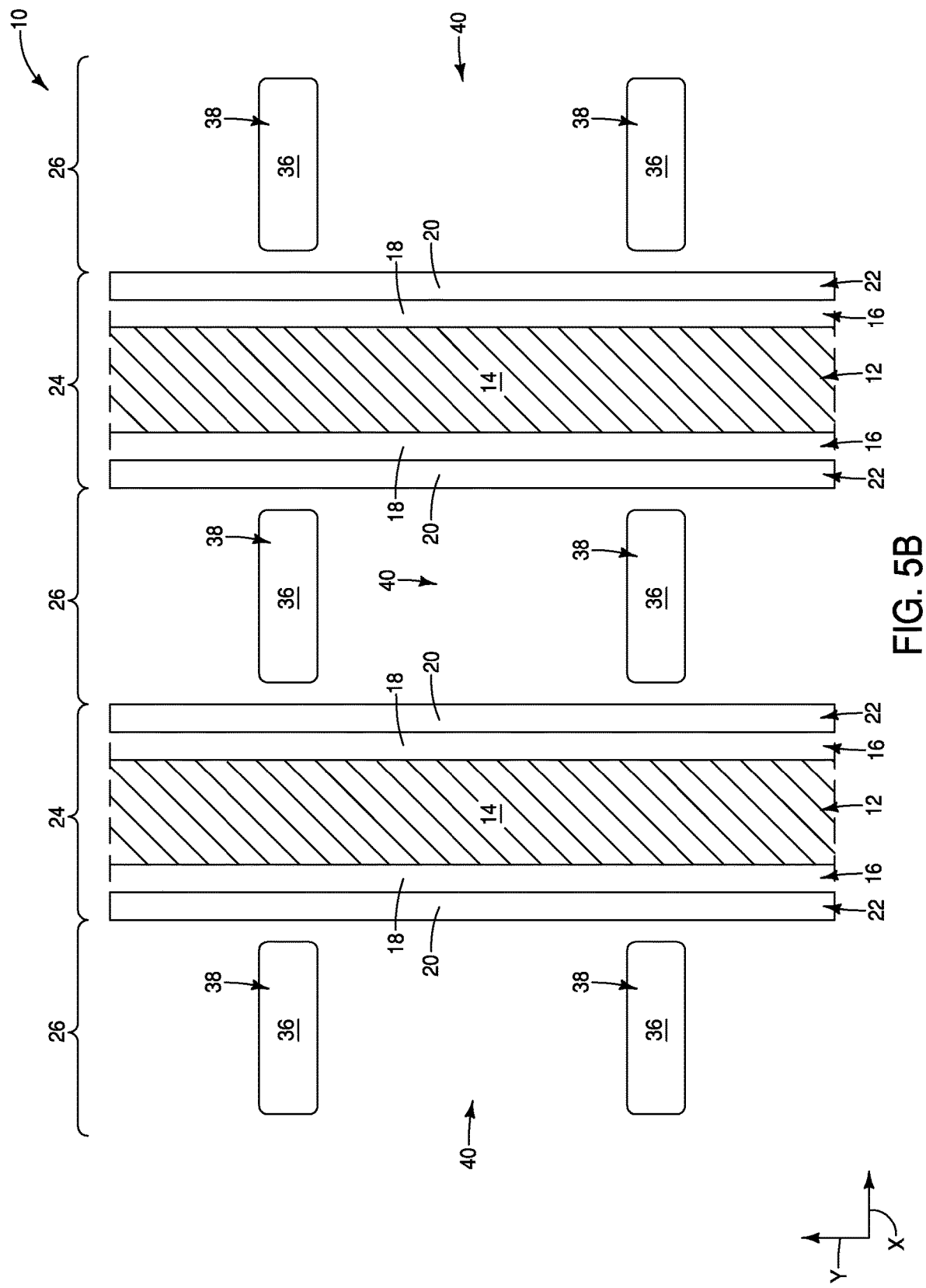

Referring to FIGS. 5A and 5B, another photoresist mask (not shown) may be provided to expose the memory cell array area while protecting the peripheral circuit area, and the silicon dioxide 28 (FIGS. 4A and 4B) is then selectively removed relative to the first and second silicon nitride compositions 20 and 36 to leave second openings 40 which are laterally bounded by the first and second silicon nitride compositions. The silicon dioxide 28 may be selectively removed relative to the silicon nitride compositions 20 and 36 utilizing any suitable processing; and in some embodiments may be selectively removed utilizing hydrofluoric acid (HF). For purposes of understanding this disclosure and the claims that follow, a first material is considered to be "selectively removed" relative to another material if the first material is removed faster than the other material; which can include, but is not limited to, conditions which are 100% selective for the removal of the first material relative to the other material.

Additional etching is utilized to remove some of the second silicon nitride composition 36, and to thereby reduce the size of the silicon nitride plugs 38. The plugs 38 at the processing stage of FIGS. 5A and 5B may be considered to be shaped (i.e., modified) relative to the plugs 38 at the processing stage of FIGS. 4A and 4B. The additional etching is selective for the second silicon nitride composition 36 relative to the first silicon nitride composition 20. The additional etching may utilize a piranha etch; and specifically may utilize an etchant comprising a mixture of sulfuric acid ($H_2SO_4$) and hydrogen peroxide ($H_2O_2$). The sulfuric acid and hydrogen peroxide may be provided in any suitable proportions; and in some embodiments the etchant mixture may be formed by mixing about 3 parts concentrated sulfuric acid with about one part of 30% hydrogen peroxide solution. In some embodiments, the piranha etch may be utilized to remove the photoresist mask (not shown) that has been used to protect the peripheral circuit area from the wet etching on the silicon dioxide 28 (FIGS. 4A and 4B) of the memory cell array area.

The piranha etch may be alternatively referred to as an SPM (sulfuric acid/hydrogen peroxide mixture) etch. The SPM etch may be conducted at any suitable temperature; and in some embodiments may be conducted while a temperature of the etchant is maintained within a range of from about 80° C. to about 100° C. The SPM etch may be conducted at any suitable pressure; and in some embodiments may be conducted at atmospheric pressure.

In the shown embodiment, the etching of the second silicon nitride composition 36 reduces dimensions of the silicon nitride plugs 38 by a greater amount along the y-axis than along the x-axis due to the bitline structures 24 providing some protection to nearby regions of the second silicon nitride material 36. In other embodiments, the amount of etching of the silicon nitride plugs 38 along the y-axis direction may be more comparable to that along the x-axis direction than is shown in the example embodiment illustrated herein.

Figure 6A:
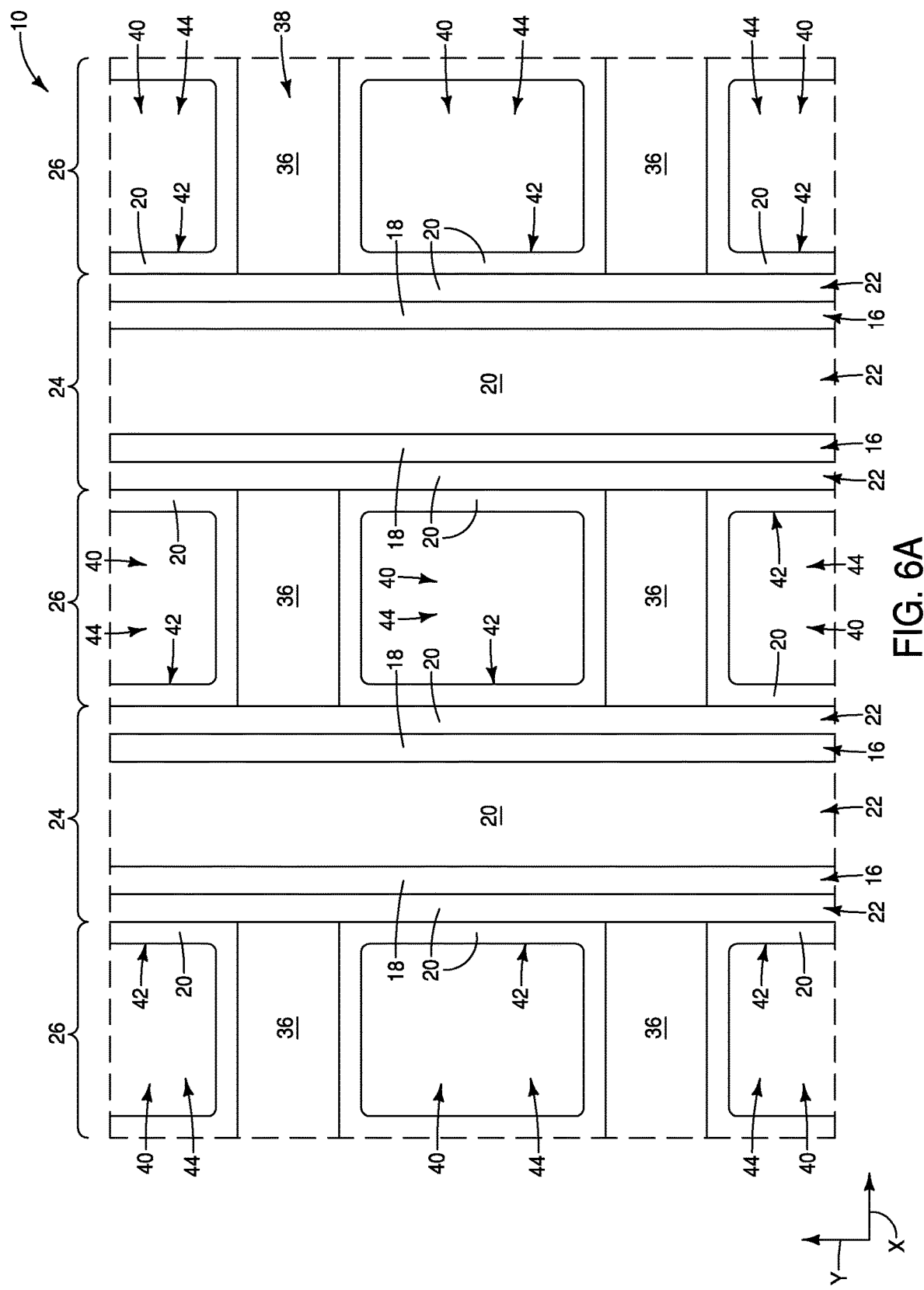
FIGS. 6A and 6B are diagrammatic cross-sectional top-down views along the lines A-A and B-B, respectively, of FIG. 1 at an example process stage which may follow that of FIGS. 5A and 5B.
Figure 6B:
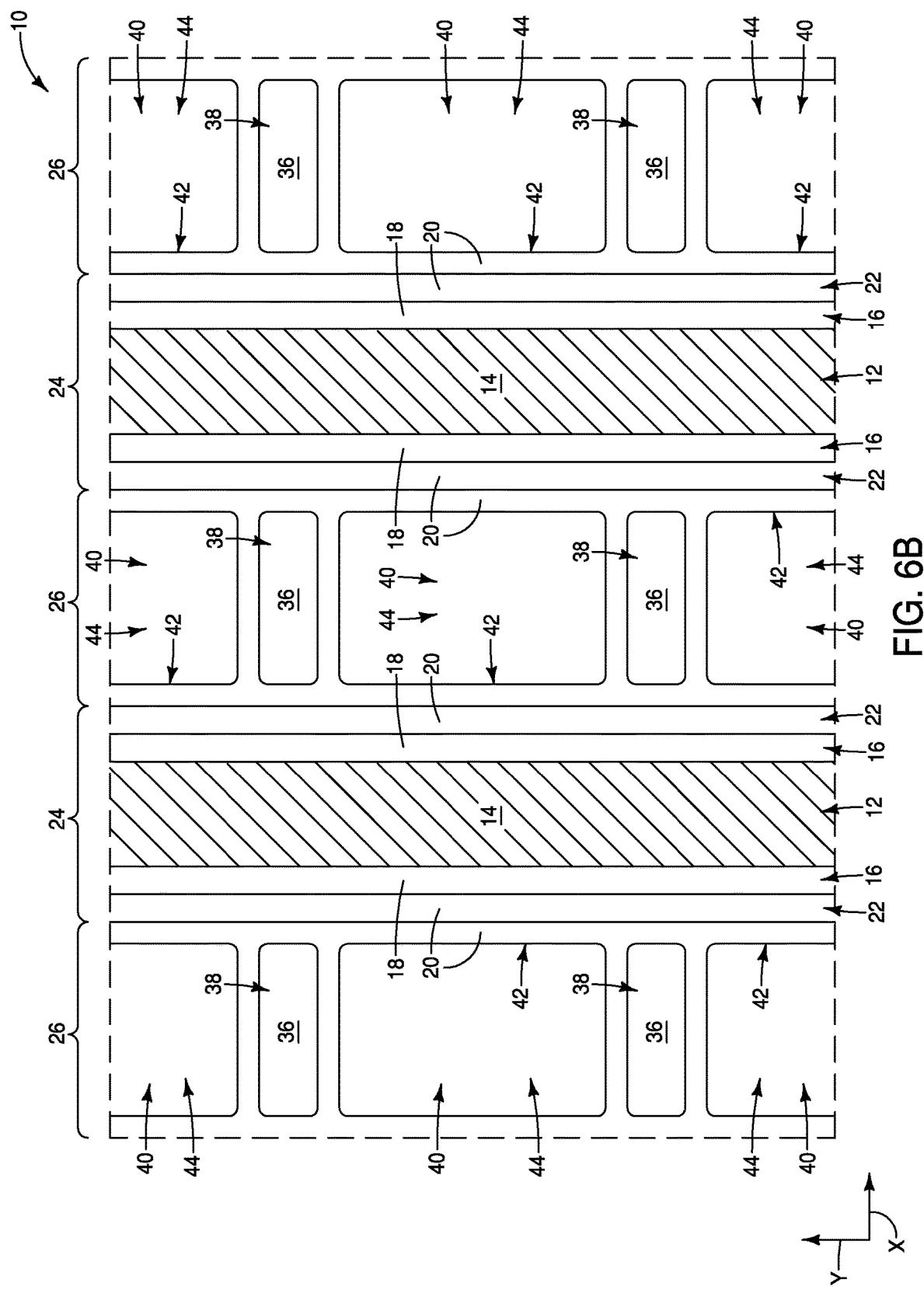

Referring to FIGS. 6A and 6B, liners 42 are formed within the second openings 40. The liners 42 may comprise any suitable electrically insulative composition(s); and in some embodiments may comprise, consist essentially of, or consist of silicon nitride. In the shown embodiment, the liners 42 comprise the first silicon nitride composition 20.

The liners 42 subdivide the second openings 40 into contact holes 44. Each of the contact holes 44 is laterally surrounded by an insulative boundary comprising the nitride materials 36 and 20.

The liners 42 may have any suitable thickness; and in some embodiments may have a thickness within the range of from about 5 nanometers (nm) to about 15 nm.

The liners 42 have regions extending along lateral peripheries of the silicon nitride plugs 38.

The shaping of the nitride plugs 38 at the processing stage of FIGS. 5A and 5B narrows such plugs, and thereby can enable the contact openings 44 to be wider than would be achieved without the narrowing of the silicon nitride plugs 38.

Figure 7A:
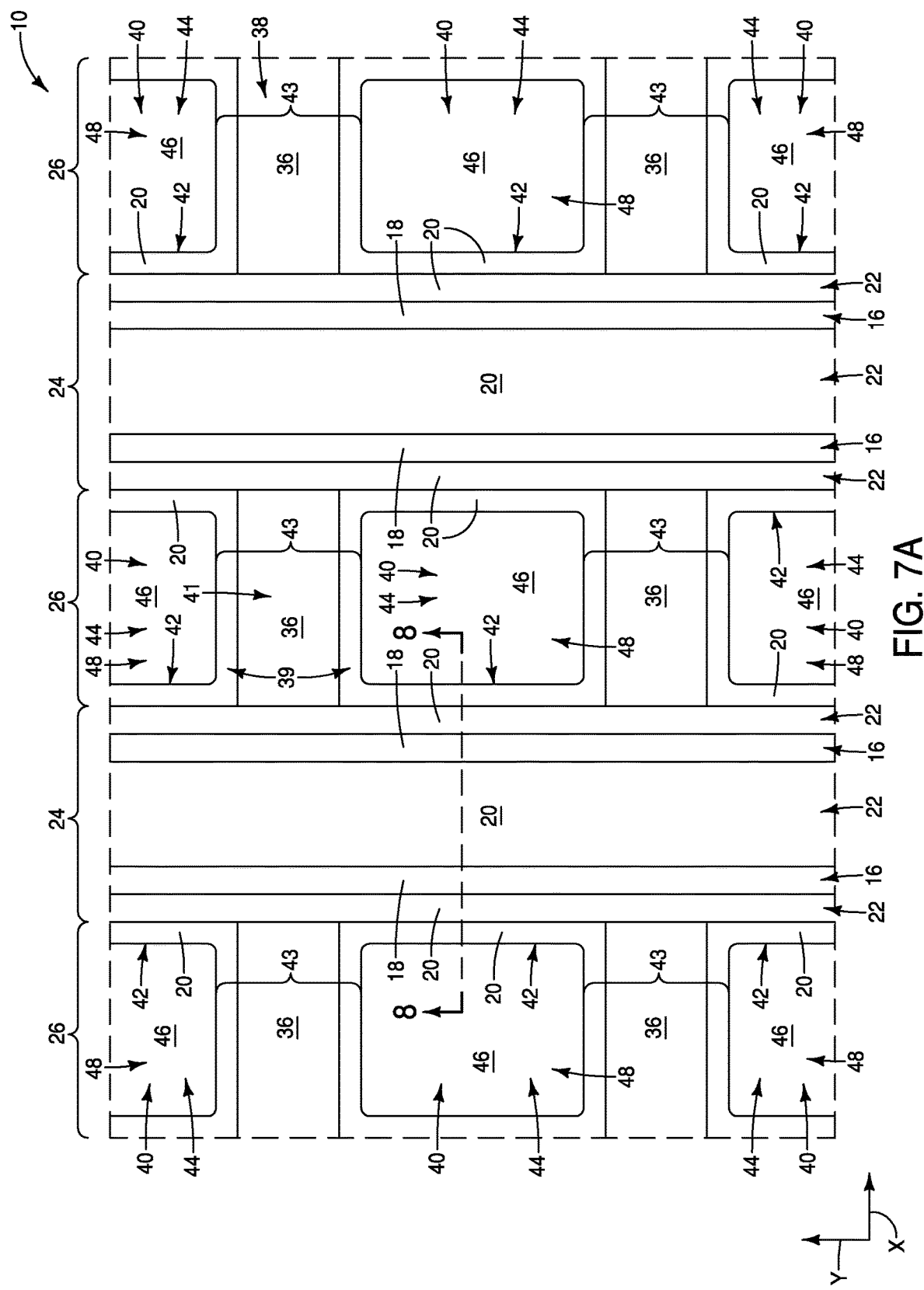

Referring to FIGS. 7A and 7B, semiconductor material 46 is formed within the second openings 40; and in the shown embodiment is formed within the contact openings 44 which have been patterned from the second openings 40. The semiconductor material 46 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). The semiconductor material 46 may be conductively-doped to form conductive contact regions 48. In some example embodiments, the semiconductor material 46 may comprise conductively-doped silicon (e.g., conductively-doped polycrystalline silicon). The conductively-doped silicon may be n-type or p-type, depending on the application.

In some embodiments, the liners 42 and the silicon nitride plugs 38 may be considered together to form insulative spacers 43. The contact regions 48 and the insulative spacers 43 are within the intervening regions 26. The contact regions 48 alternate with the insulative spacers 43 along the y-axis direction (i.e., along the first direction).

In some embodiments, the insulating spacers 43 may be considered to comprise first regions 39 of the first silicon nitride composition 20, together with second regions 41 of the second silicon nitride composition 36. In the shown embodiment of FIGS. 7A and 7B, the second regions 41 (i.e., the regions of the spacers 43 comprising the second silicon nitride composition 36) are configured as solid cores, and the first regions 39 (i.e., the regions of the spacers 43 comprising the first silicon nitride composition 20) are configured as liners 42 which extend along lateral surfaces of the solid cores of the second silicon nitride composition 36. Further, FIG. 7B shows that the liners 42 of the first silicon nitride composition 20 extend entirely around the solid cores of the second silicon nitride composition 36 along the lower portions of the second regions 41, and FIG. 7A shows that the liners 42 extend only partially around the solid cores of the second silicon nitride composition 36 along upper portions of the second regions 41.

Figure 8:
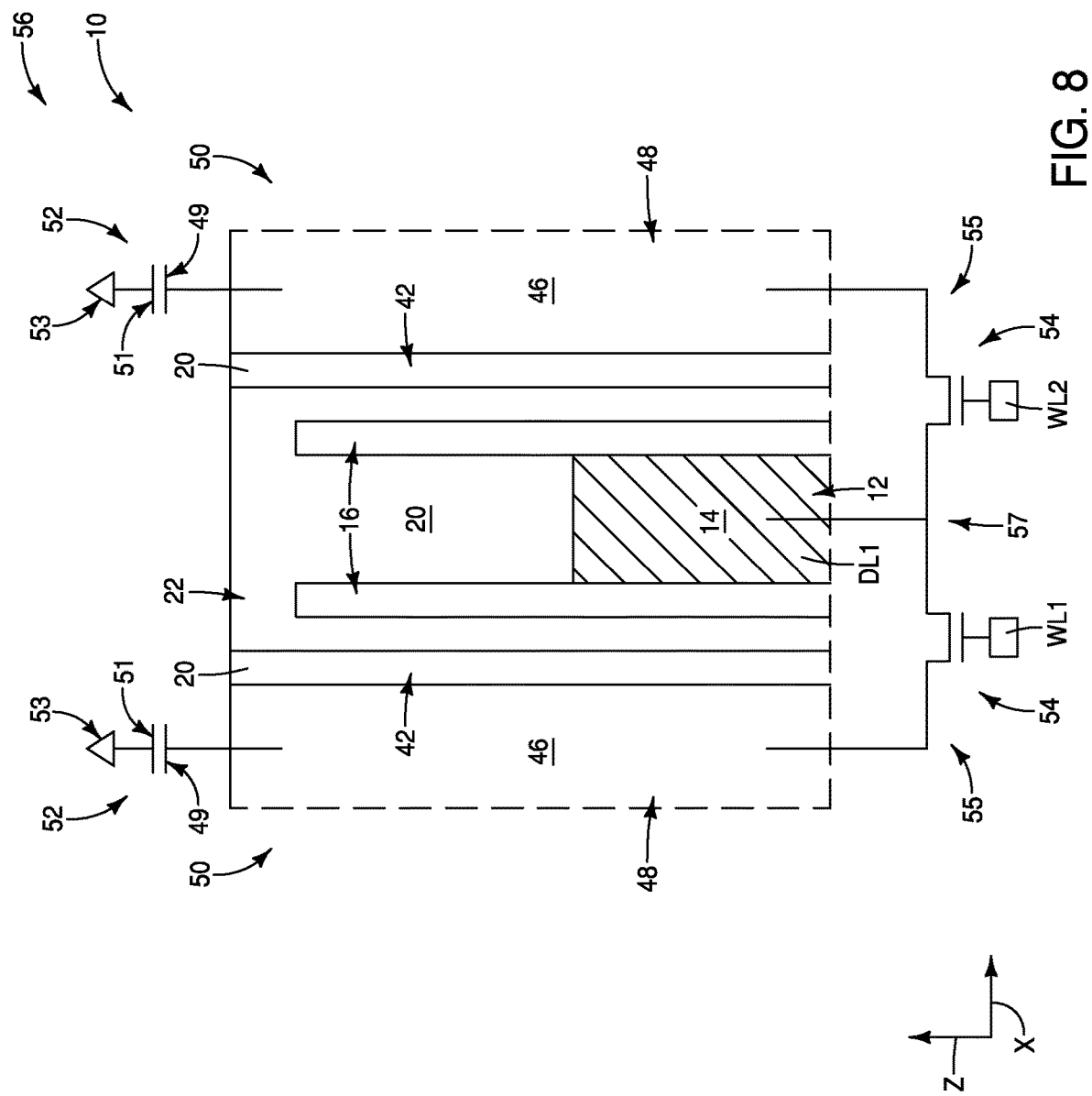
FIG. 8 is a diagrammatic cross-sectional side view along the line 8-8 of FIGS. 7A and 7B, and shows an example pair of memory adjacent memory cells that may be formed utilizing the architecture of FIGS. 7A and 7B.

The conductive contact regions 48 may be referred to as semiconductor structures (or as semiconductor plugs). The semiconductor structures 48 may be incorporated into memory cells. For instance, FIG. 8 shows a region along the line 8-8 of FIGS. 7A and 7B; and shows a pair of memory cells 50 comprising the semiconductor structures (contact regions) 48. Each of the memory cells includes a storage element 52 and an access transistor 54.

The storage-elements 52 may be any suitable devices having at least two detectable states; and in some embodiments may be, for example, capacitors, resistive-memory devices, conductive-bridging devices, phase-change-memory (PCM) devices, programmable metallization cells (PMCs), etc. In the shown embodiment, the storage elements 52 are capacitors. Each of the capacitors has an electrode 49 electrically coupled with a contact region 48, and has another electrode 51 electrically coupled with a reference voltage 53. The reference voltage 53 may be any suitable voltage; and in some embodiments may be ground, VCC/2, etc.

Each of the access transistors 54 has a first source/drain region 55 which is electrically coupled with a contact region 48, and has a second source/drain region 57 which is electrically coupled with a bitline 12. In the shown embodiment, the second source/drain regions 57 of the illustrated access transistors 54 are shared. The storage elements 52 are electrically coupled with the access transistors 54 through the contact regions 48.

Wordlines WL1 and WL2 are electrically coupled with gates of the illustrated access transistors 54. Also, the bitline 12 is shown corresponding to a first bitline (digit line) DL1.

Figure 9:
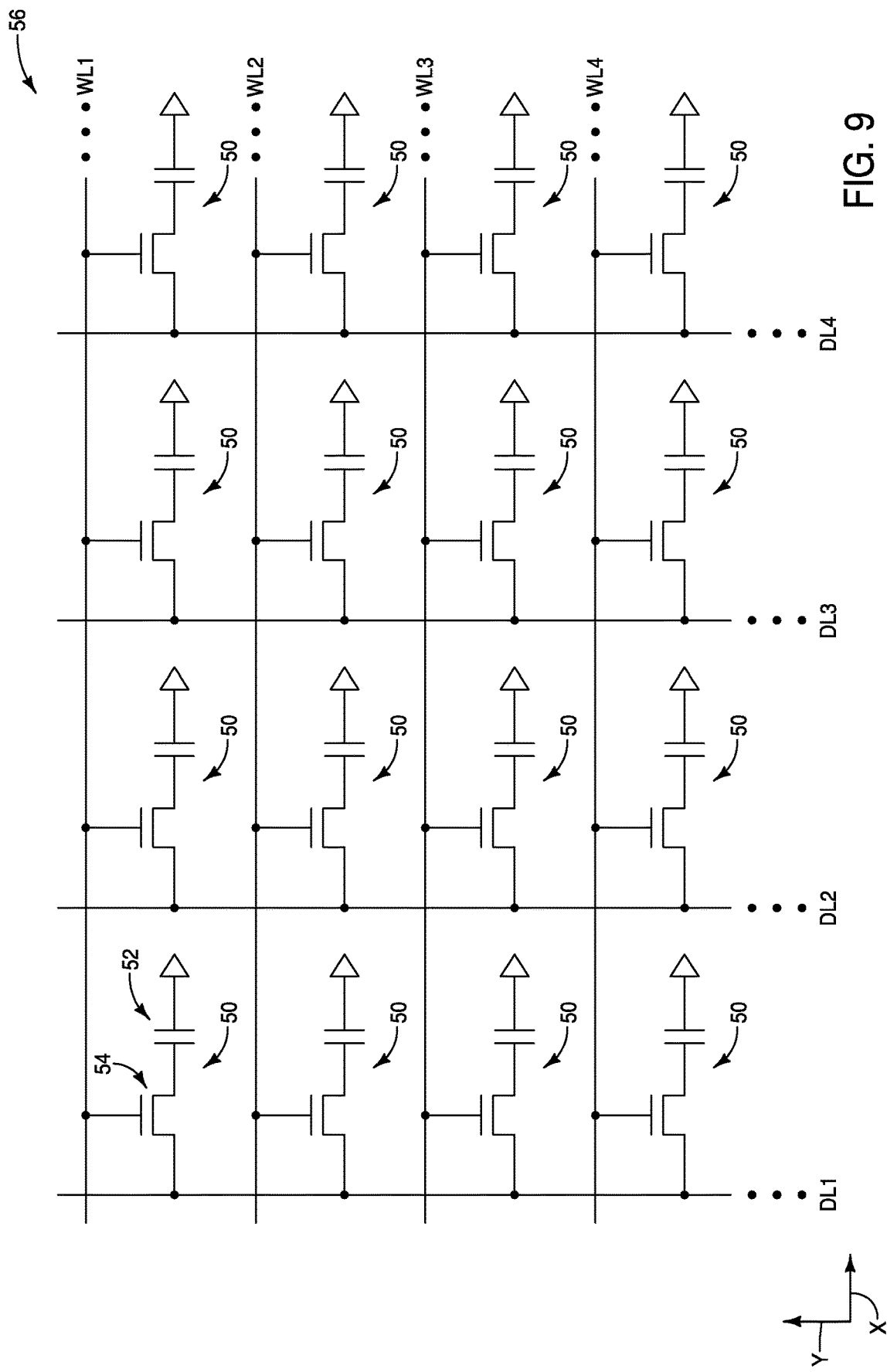
FIG. 9 is a diagrammatic schematic view of a region of an example memory array.

The illustrated memory cells 50 may be considered to be representative of a large number of substantially identical memory cells of a memory array 56 (with the term "substantially identical" meaning identical to within reasonable tolerances of fabrication and measurement). FIG. 9 schematically illustrates a region of an example memory array 56. The memory array includes memory cells 50, wordlines WL1-WL4, and bitlines (digit lines) DL1-DL4. Each of the memory cells is uniquely addressed with a combination of one of the wordlines and one of the digit lines. The illustrated memory cells may be representative of a large number of memory cells of the memory array. For instance, in some embodiments the memory array may comprise hundreds, thousands, millions, hundreds of millions, etc., of memory cells.

FIGS. 1-7 may be considered to illustrate a first example embodiment method for fabricating contact regions suitable for coupling with storage elements of a memory array. Another example method is described with reference to FIGS. 10-15.

Figure 10A:
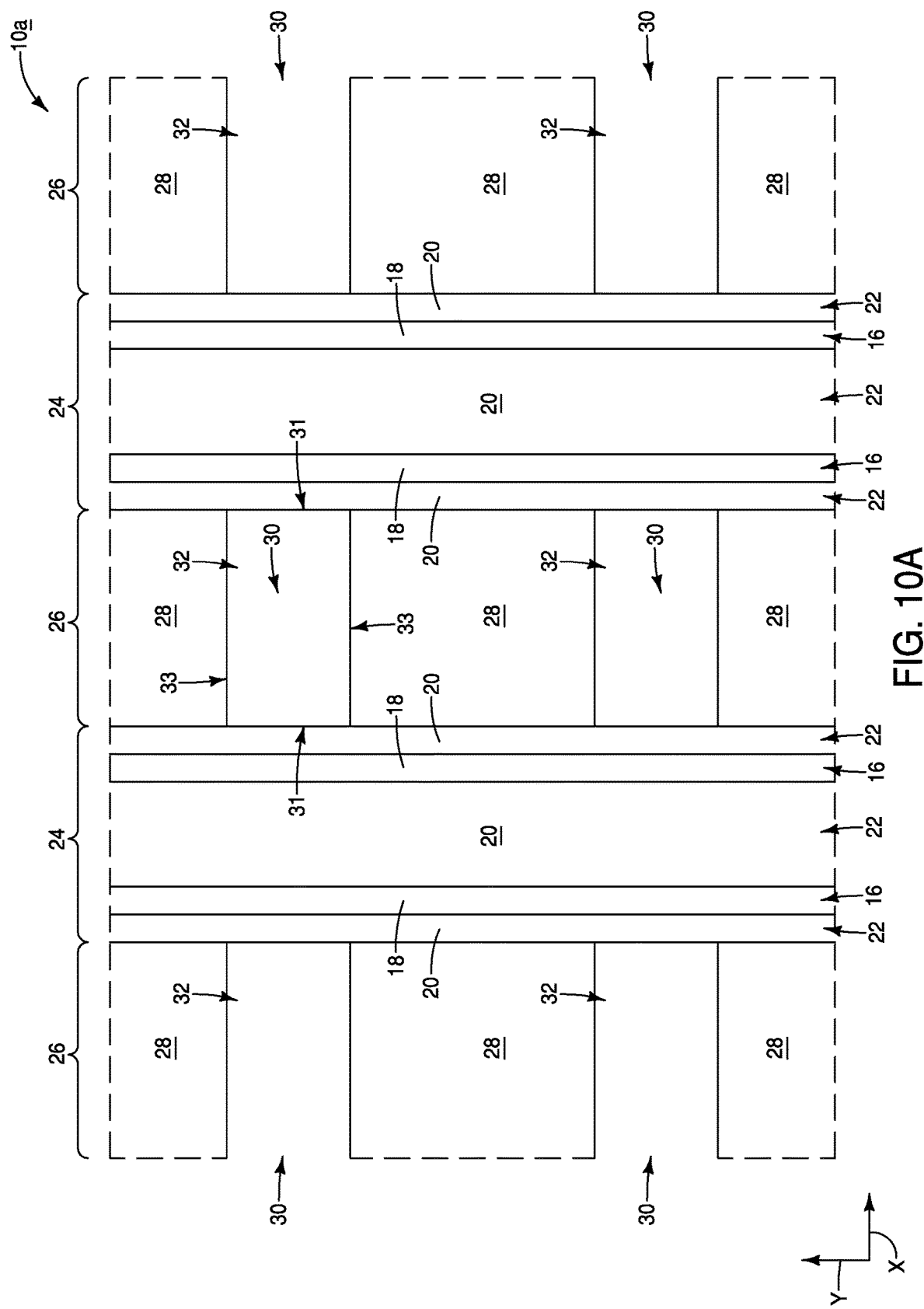
FIGS. 10A and 10B are diagrammatic cross-sectional top-down views along the lines A-A and B-B, respectively, of FIG. 1 at an example process stage identical to that of FIGS. 3A and 3B.
Figure 10B:
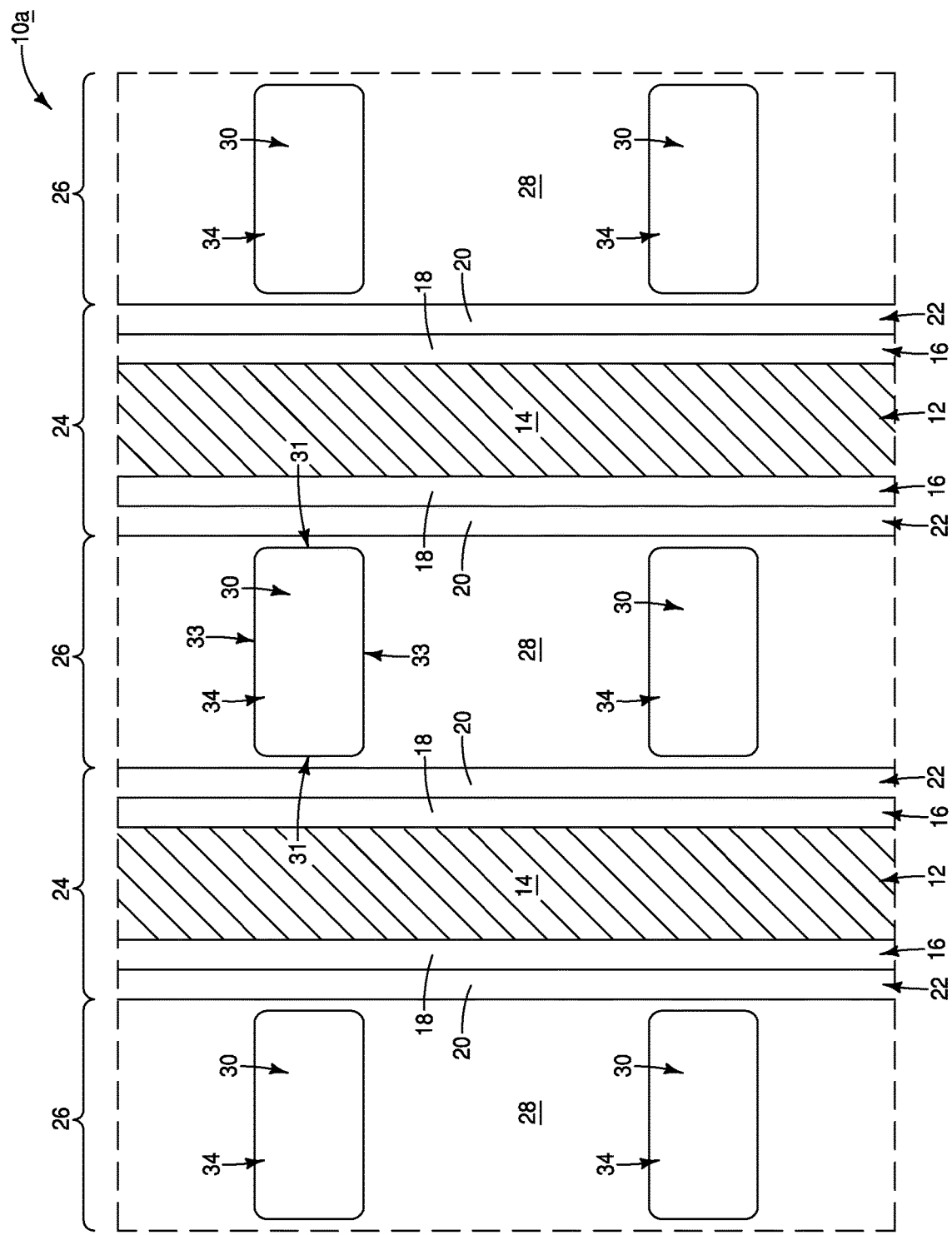

Referring to FIGS. 10A and 10B, an assembly 10a is shown at a process stage identical to that described above with reference to FIGS. 3A and 3B. The tapered openings 30 have been formed within the intervening regions 26.

Figure 11A:
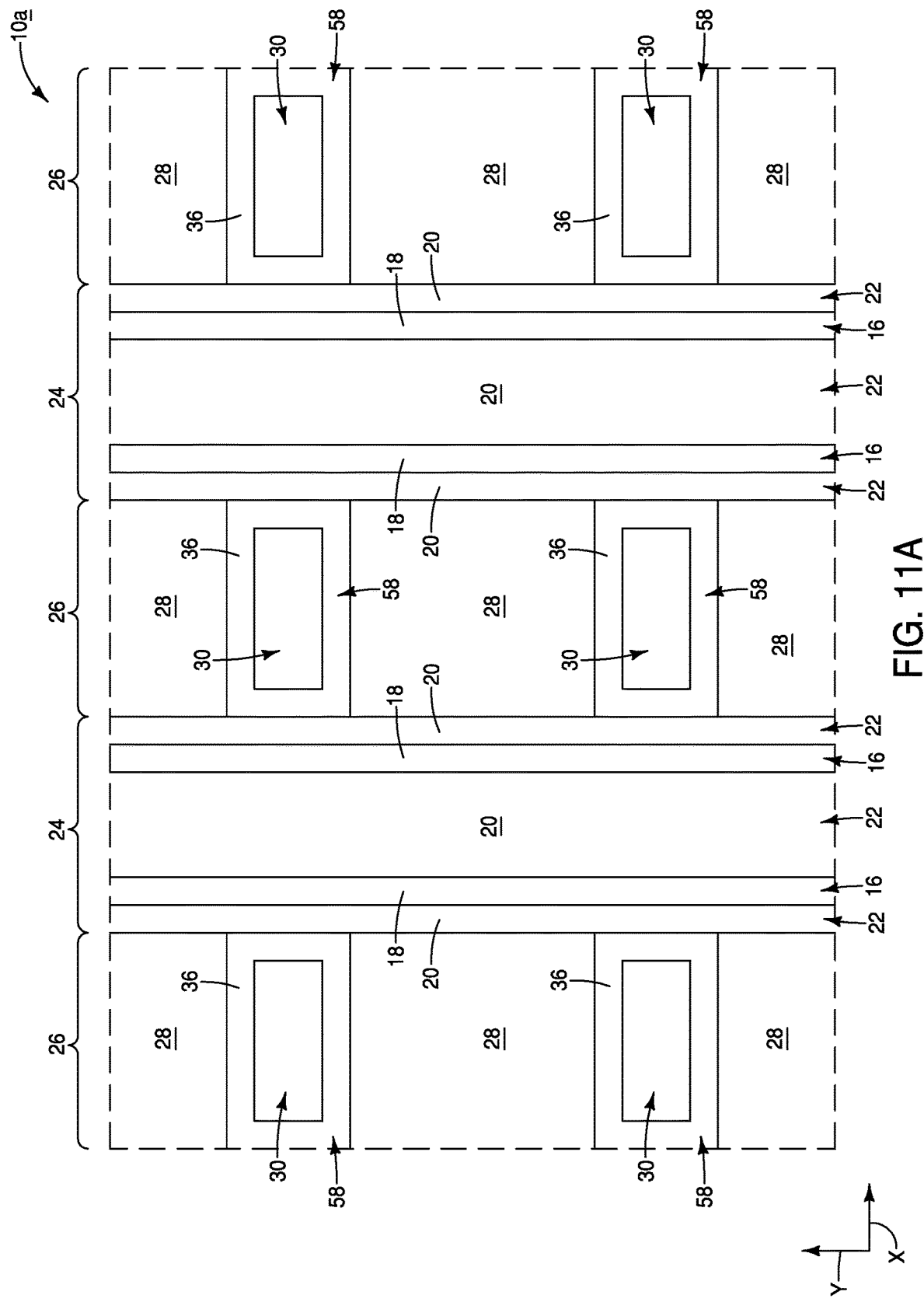
FIGS. 11A and 11B are diagrammatic cross-sectional top-down views along the lines A-A and B-B, respectively, of FIG. 1 at an example process stage which may follow that of FIGS. 10A and 10B.
Figure 11B:
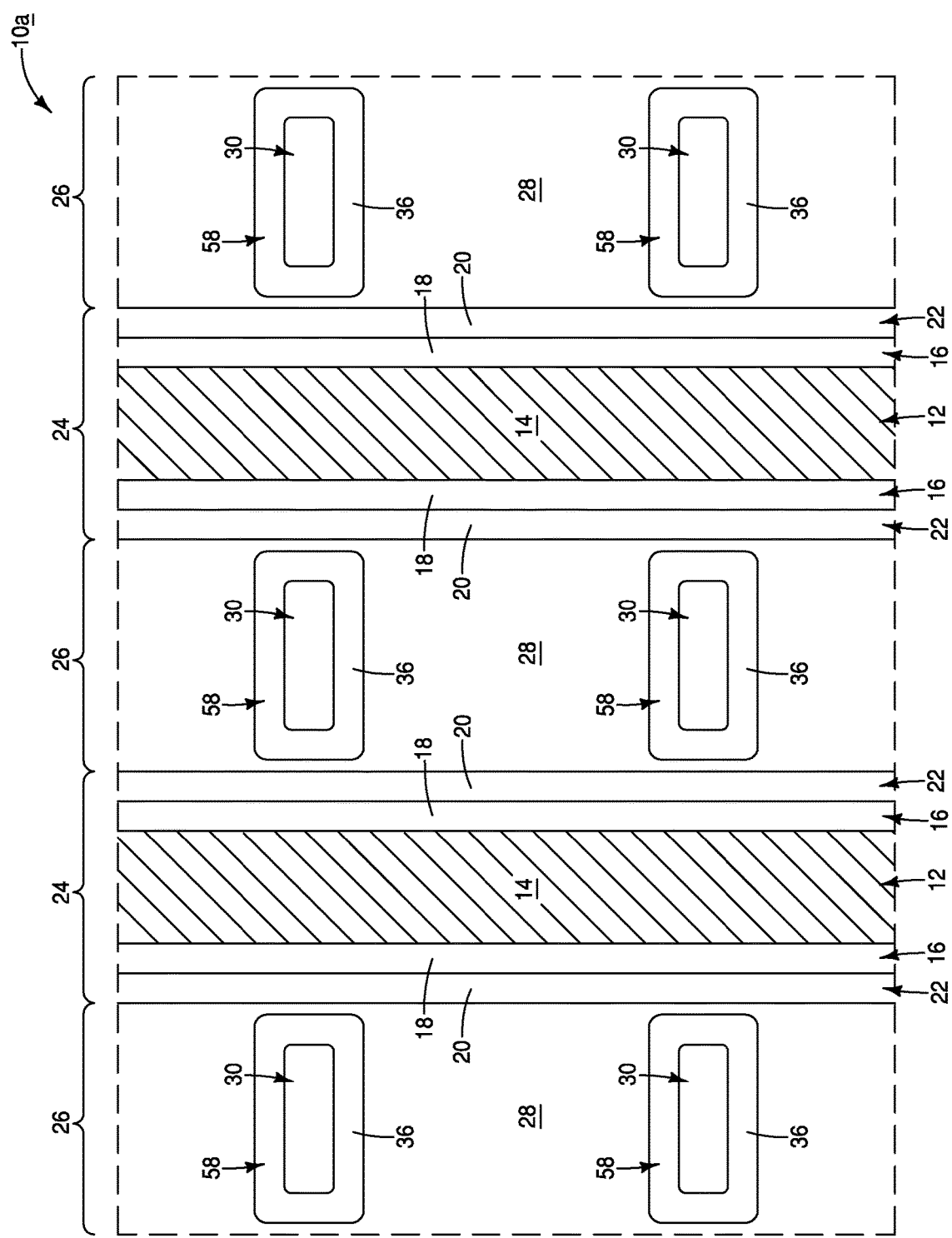

Referring to FIGS. 11A and 11B, the second silicon nitride composition 36 is formed within the openings 30, and is configured as liners 58 which narrow the openings. The liners 58 may have any suitable thickness, and in some embodiments may have a thickness within a range of from about 5 nm to about 15 nm.

Figure 12A:
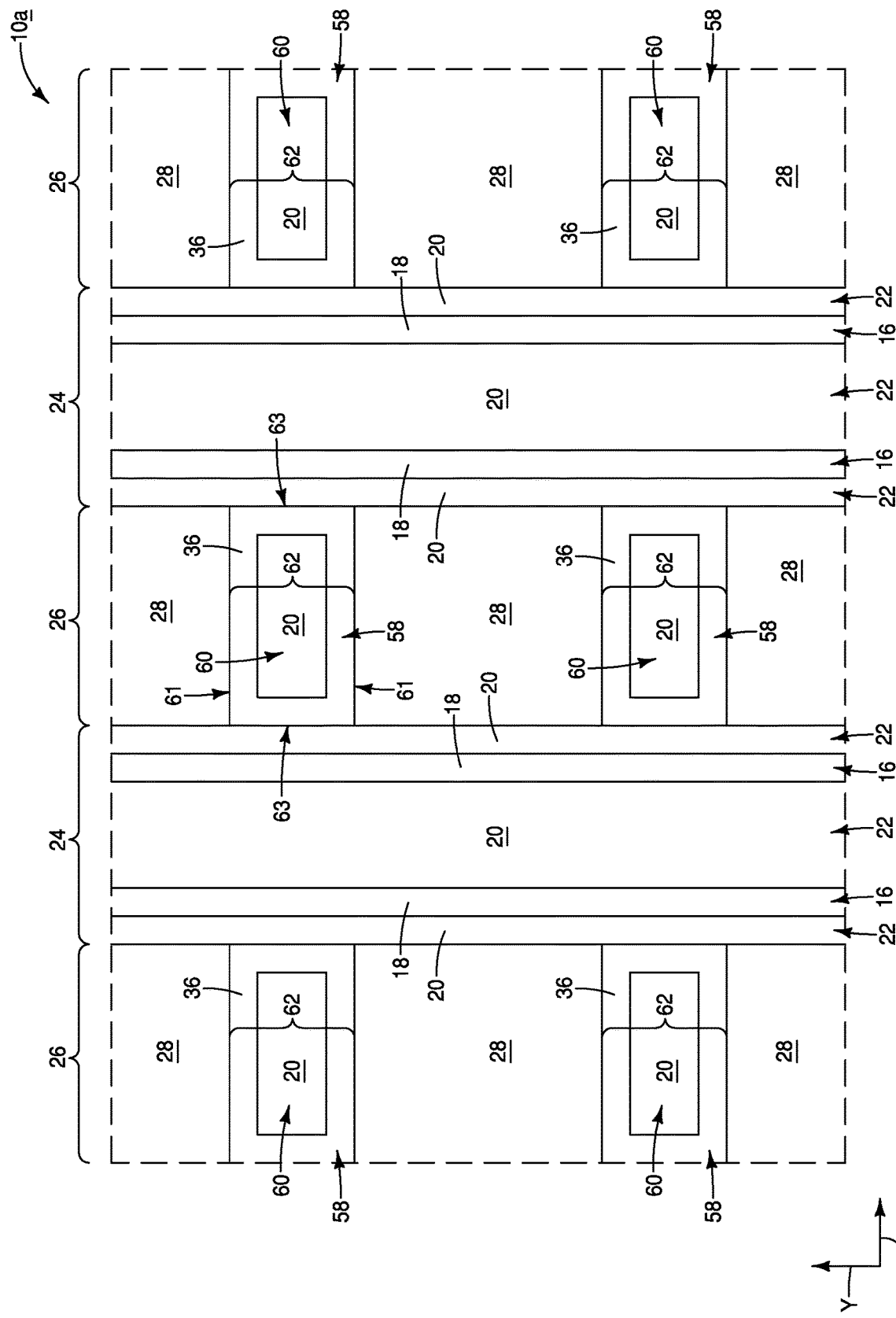
FIGS. 12A and 12B are diagrammatic cross-sectional top-down views along the lines A-A and B-B, respectively, of FIG. 1 at an example process stage which may follow that of FIGS. 11A and 11B.
Figure 12B:
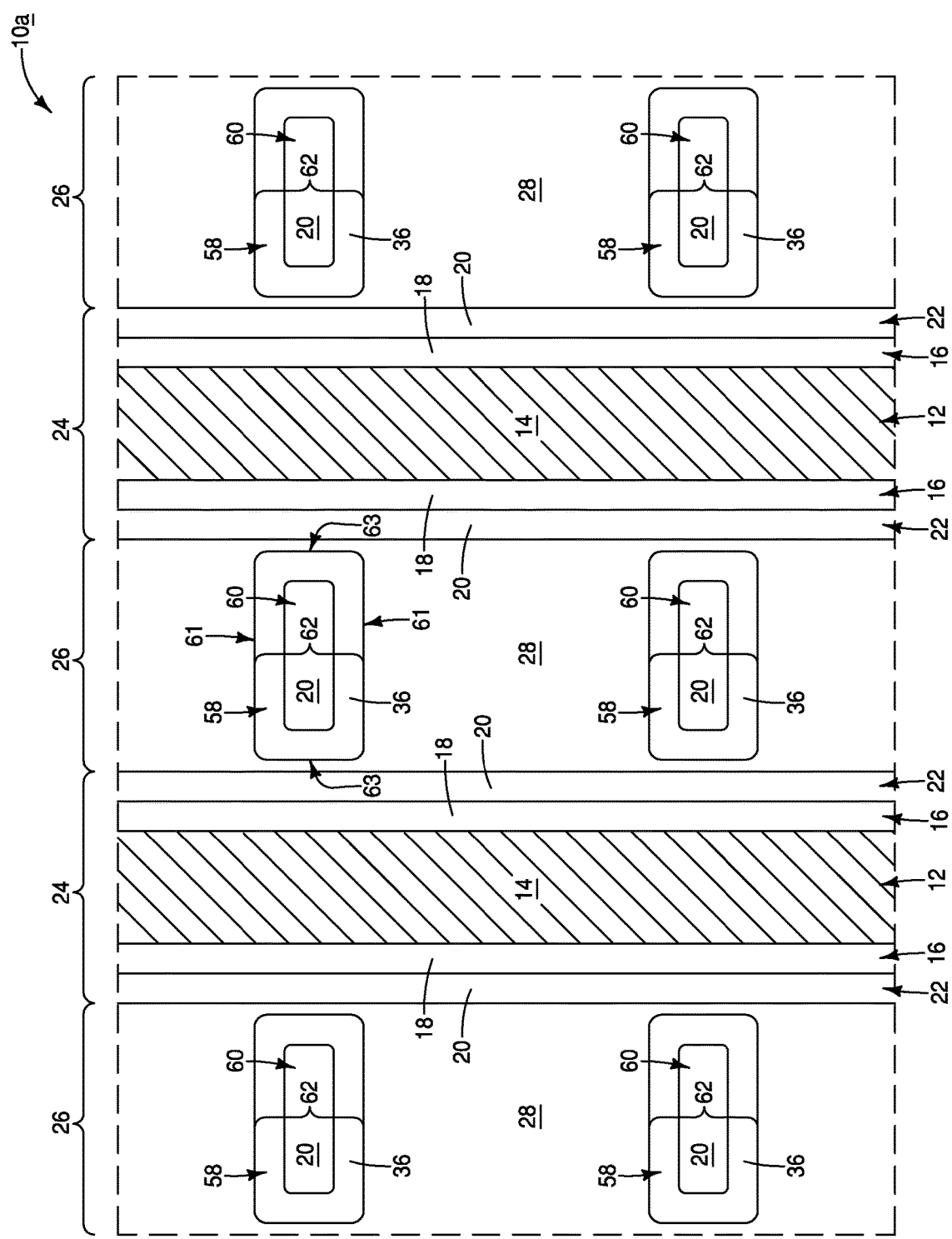

Referring to FIGS. 12A and 12B, the first silicon nitride composition 20 is deposited within the narrowed openings 30 (with the openings 30 being labeled in FIGS. 11A and 11B). The first and second silicon nitride compositions 20 and 36 together form structures 62. The structures 62 have core regions 60 comprising the first silicon nitride composition 20, and have the liners 58 laterally surrounding the core regions. In some embodiments, the structures 62 may be considered to be silicon nitride plugs.

Each of the silicon nitride plugs 62 has a pair of opposing long edges 61 extending along the second direction of the x-axis, and has a pair of opposing short edges 63 extending along the first direction of the y-axis.

Figure 13A:
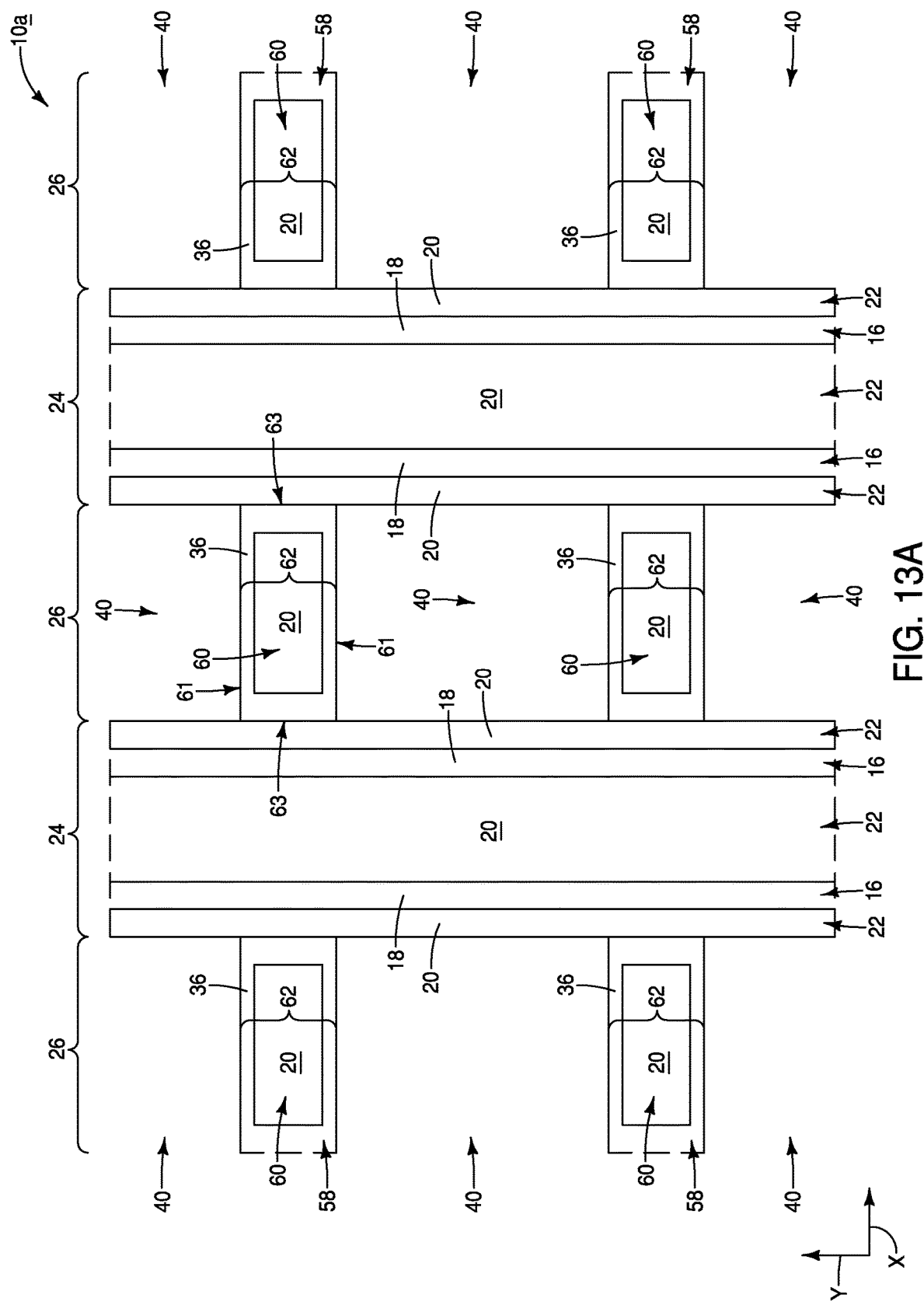
FIGS. 13A and 13B are diagrammatic cross-sectional top-down views along the lines A-A and B-B, respectively, of FIG. 1 at an example process stage which may follow that of FIGS. 12A and 12B.
Figure 13B:
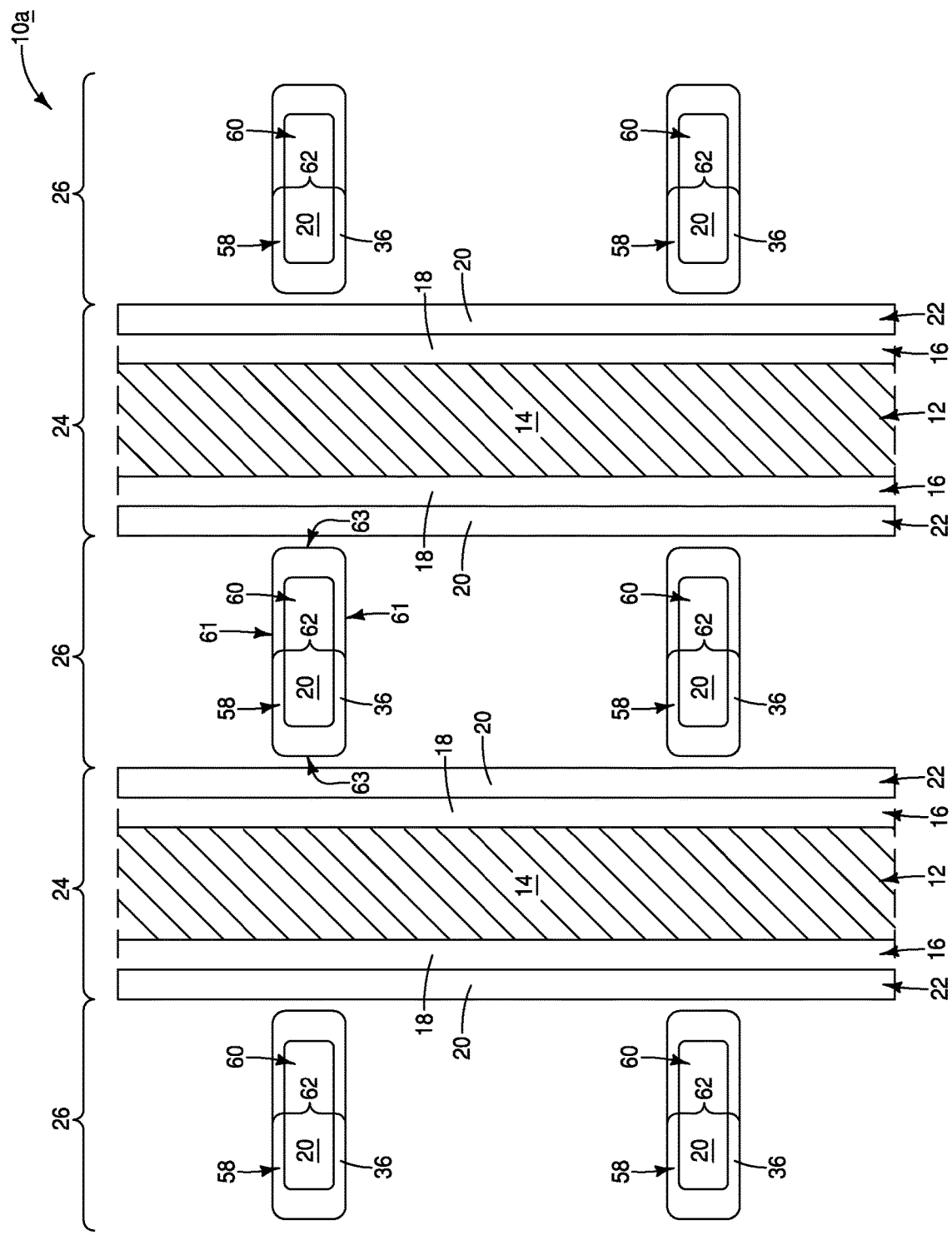

Referring to FIGS. 13A and 13B, the silicon dioxide 28 (FIGS. 12A and 12B) is selectively removed relative to the first and second silicon nitride compositions 20 and 36 with processing analogous to that described above with reference to FIGS. 5A and 5B. Such forms the second openings 40 within the intervening regions 26. Additional etching is conducted to selectively remove some of the second silicon nitride composition 36 relative to the first silicon nitride composition 20. The additional etching may utilize the SPM etch described above with reference to FIGS. 5A and 5B.

The removal of some of the second silicon nitride composition 36 reduces thicknesses of the liners 58 along the long edges 61 of the silicon nitride plugs 62, and thereby modifies (shapes) the silicon nitride plugs 62. In the shown embodiment, the removal of some of the second silicon nitride composition 36 removes enough of the liners 58 to thin the liners along the long edges 61 of the silicon nitride plugs 62, but does not punch through the liners to expose lateral edges of the first silicon nitride composition 20.

Figure 14A:
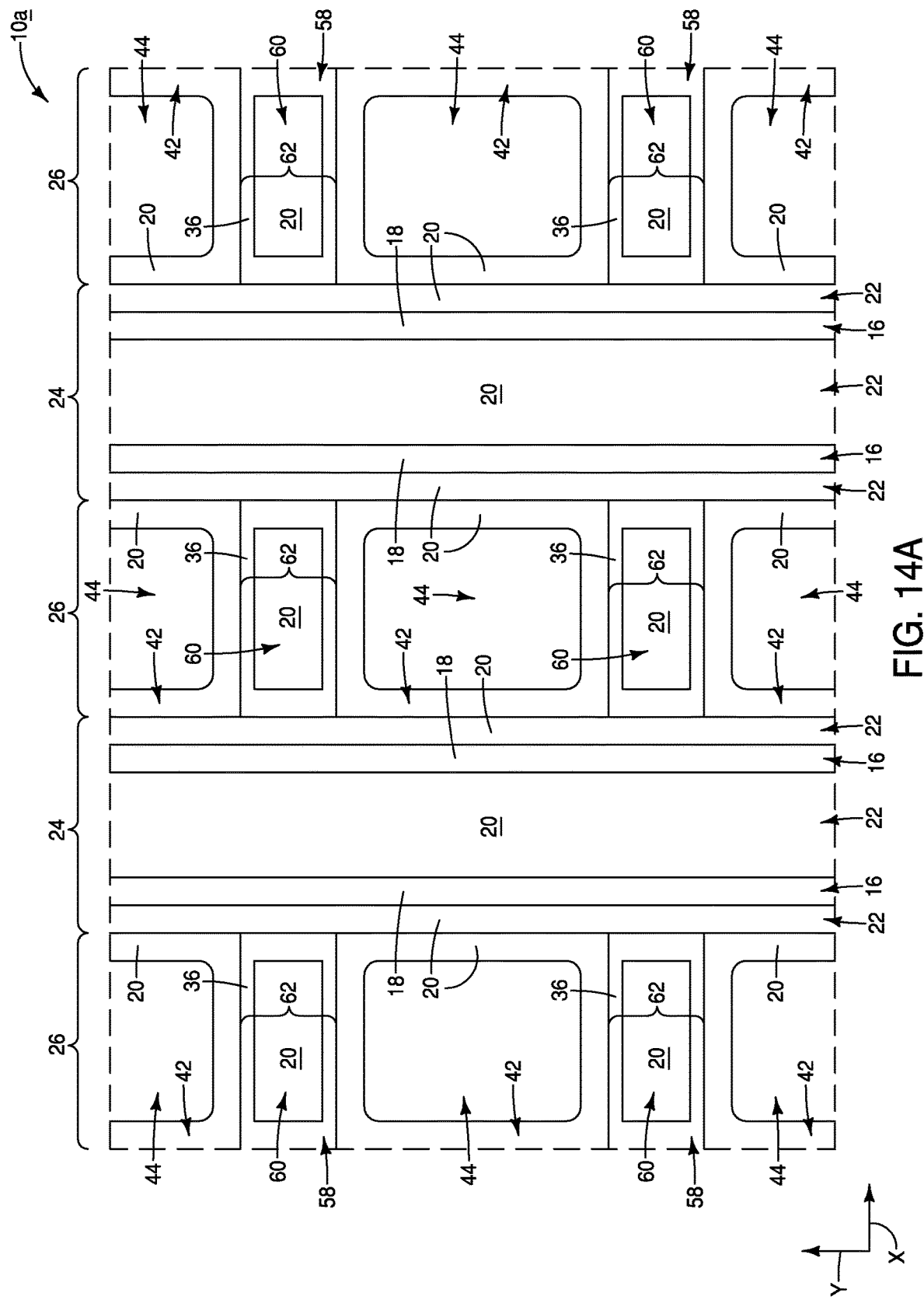
FIGS. 14A and 14B are diagrammatic cross-sectional top-down views along the lines A-A and B-B, respectively, of FIG. 1 at an example process stage which may follow that of FIGS. 13A and 13B.
Figure 14B:
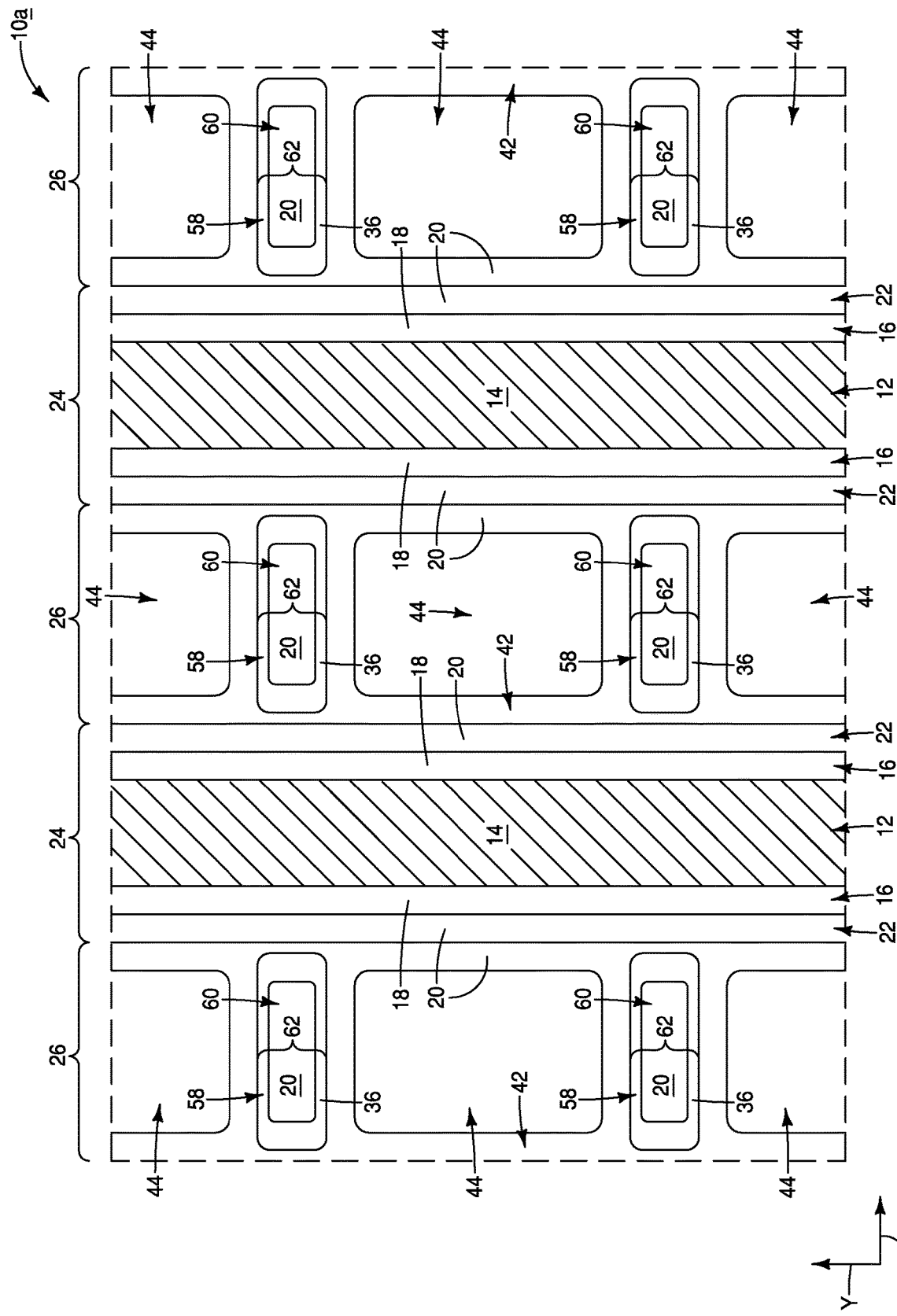

Referring to FIGS. 14A and 14B, the liners 42 are formed within the second openings 40 (FIGS. 13A and 13B) utilizing processing analogous to that described above with reference to FIGS. 6A and 6B. In the shown embodiment, the liners 42 comprise the first silicon nitride composition 20. The liners 42 subdivide the second openings 40 (FIGS. 13A and 13B) into the contact holes 44.

The shaping of the nitride plugs 62 at the processing stage of FIGS. 13A and 13B narrows such plugs, and thereby can enable the contact openings 44 to be wider than would be achieved without the narrowing of the silicon nitride plugs 62.

In some embodiments, the silicon nitride plugs 62 of FIGS. 13A and 13B may be considered to be shaped silicon nitride plugs, with the shaping of the silicon nitride plugs being accomplished through the removal of some of the second silicon nitride composition 36. The liners 58 of the first silicon nitride composition 36 may be considered to be first liners, and the liners 42 formed at the processing stage of FIGS. 14A and 14B may be considered to be second liners which are formed along lateral peripheries of the shaped silicon nitride plugs. In the illustrated embodiment, the second liners 42 comprise the first silicon nitride composition 20.

Figure 15A:
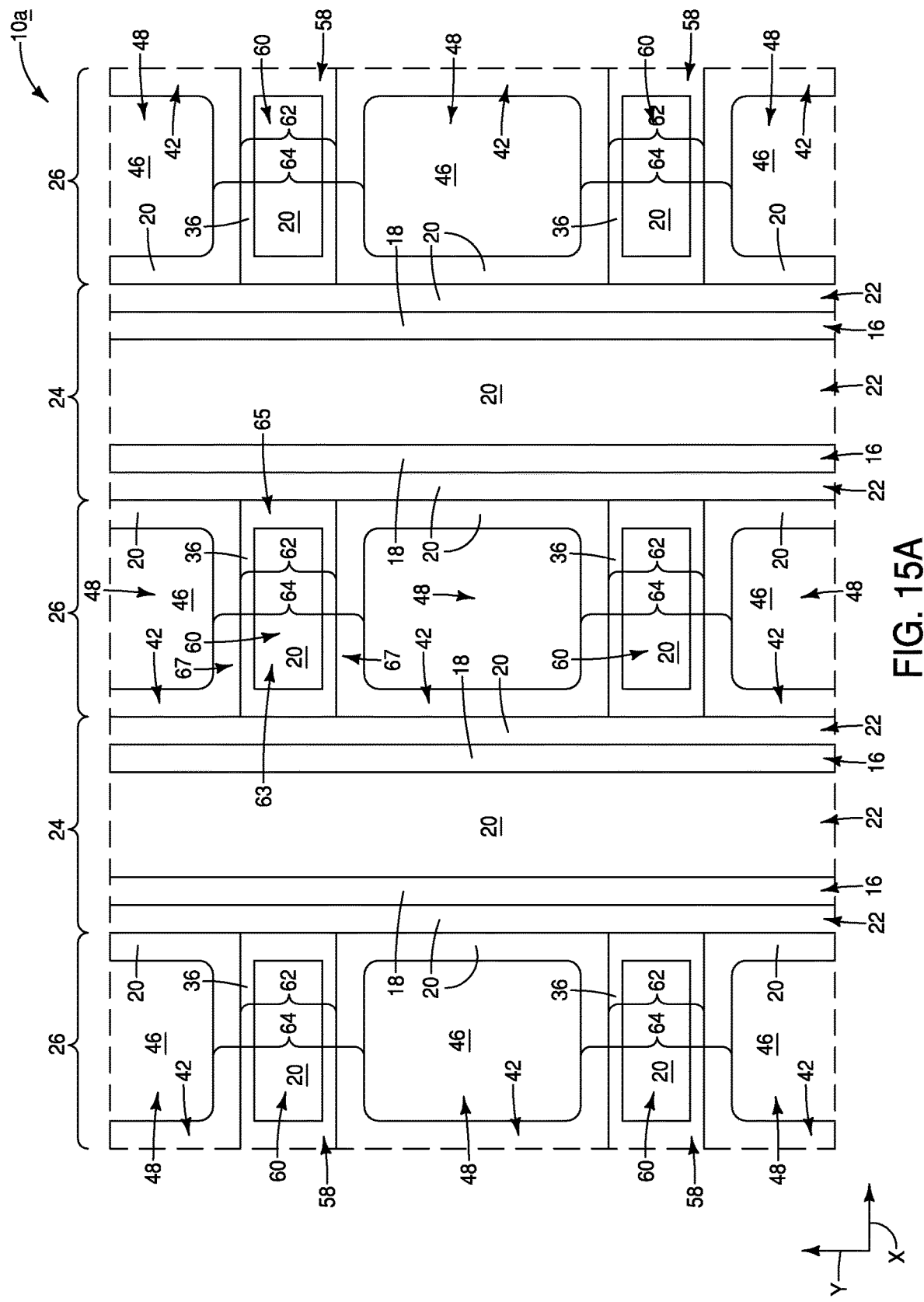
FIGS. 15A and 15B are diagrammatic cross-sectional top-down views along the lines A-A and B-B, respectively, of FIG. 1 at an example process stage which may follow that of FIGS. 14A and 14B.
Figure 15B:
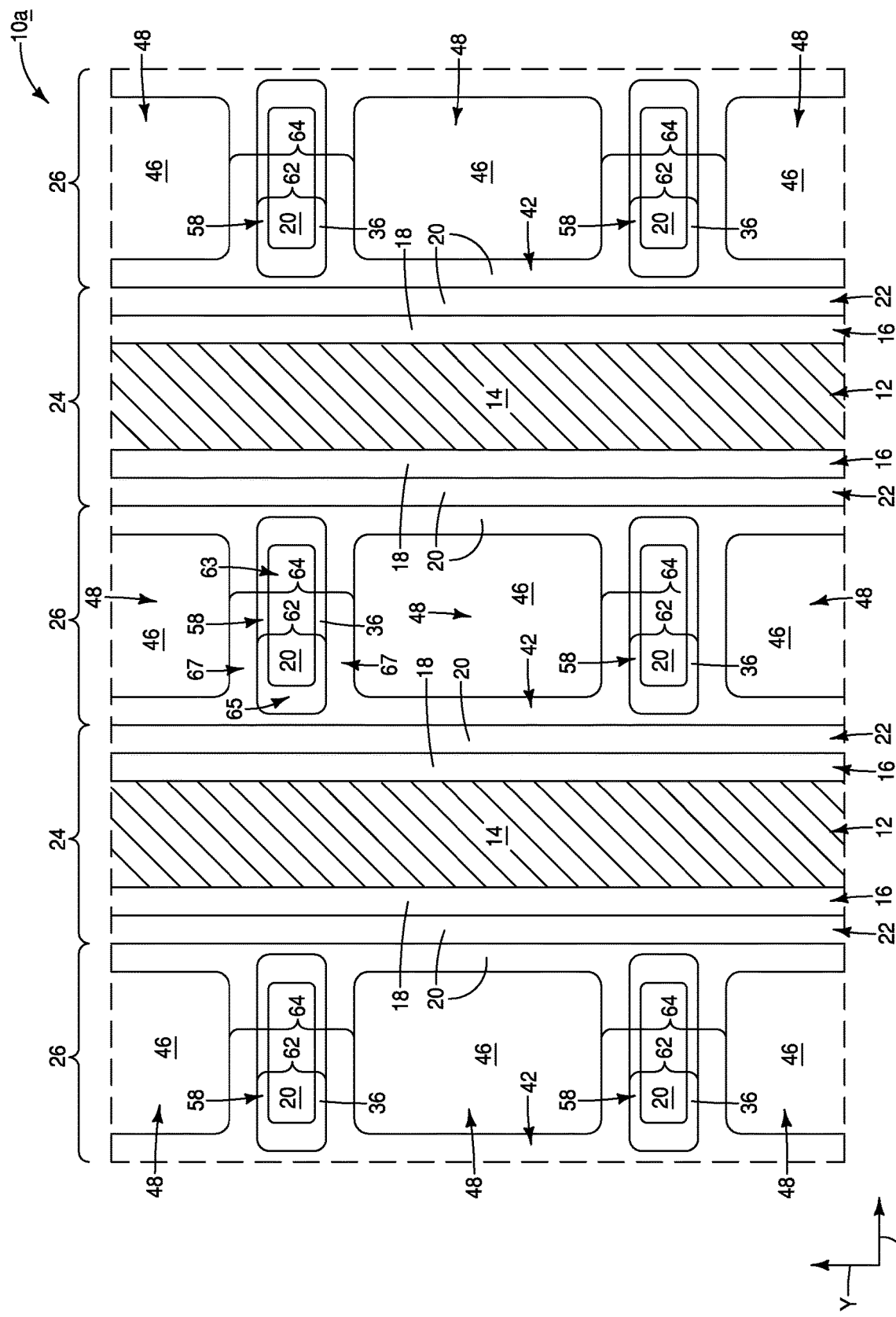

Referring to FIGS. 15A and 15B, the semiconductor material 46 is formed within the contact openings 44 (FIGS. 14A and 14B), and forms the contact regions 48.

The liners 42 and silicon nitride plugs 62 together to form insulative spacers 64 analogous to the spacers 43 described above with reference to FIGS. 7A and 7B.

The contact regions 48 and the insulative spacers 64 are within the intervening regions 26; and alternate with one another along the y-axis direction (i.e., along the first direction).

In some embodiments, the insulating spacers 64 may be considered to comprise first regions 63 of the first silicon nitride composition 20 together with second regions 65 of the second silicon nitride composition 36. In the shown embodiment of FIGS. 15A and 15B, the second regions 65 (i.e., the regions of the second silicon nitride composition 36) are configured as hollow rings, and the first regions 63 (i.e., the regions of the first silicon nitride composition 20) are configured as the solid cores 60. FIG. 15B shows that the liners 42 of the first silicon nitride composition 20 extend entirely around the hollow rings 65 of the second silicon nitride composition 36 along the lower portions of the solid cores 60, and FIG. 15A shows that the liners 42 extend only partially around the hollow rings 65 along upper portions of the solid cores 60. In some embodiments, the liners 42 may be considered to be comprised by third regions 67 of the spacers 64. In some embodiments, the first and third regions 65 and 67 of the spacers 64 may be considered to at least partially surround the solid cores 60 corresponding to the first regions 63 of the spacers 64.

The conductive contact regions 48 may be incorporated into memory cells 50 of the type described above with reference to FIG. 8. Such memory cells may be incorporated into a memory array 56 of the type described above with reference to FIG. 9.

Another example method for fabricating contact regions suitable for coupling with storage elements of a memory array is described with reference to FIGS. 16-18.

Figure 16A:
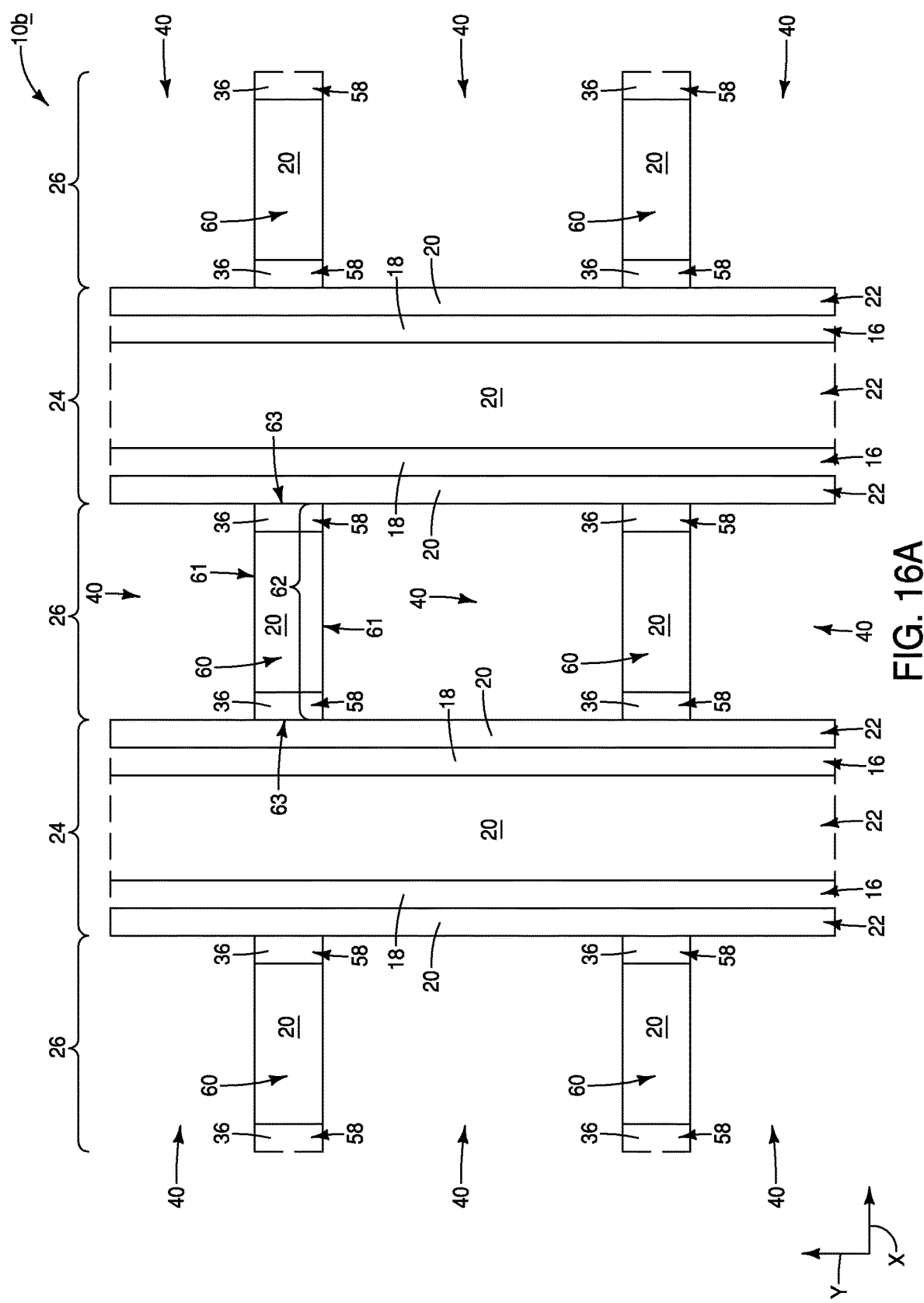
FIGS. 16A and 16B are diagrammatic cross-sectional top-down views along the lines A-A and B-B, respectively, of FIG. 1 at an example process stage which may follow that of FIGS. 12A and 12B.
Figure 16B:
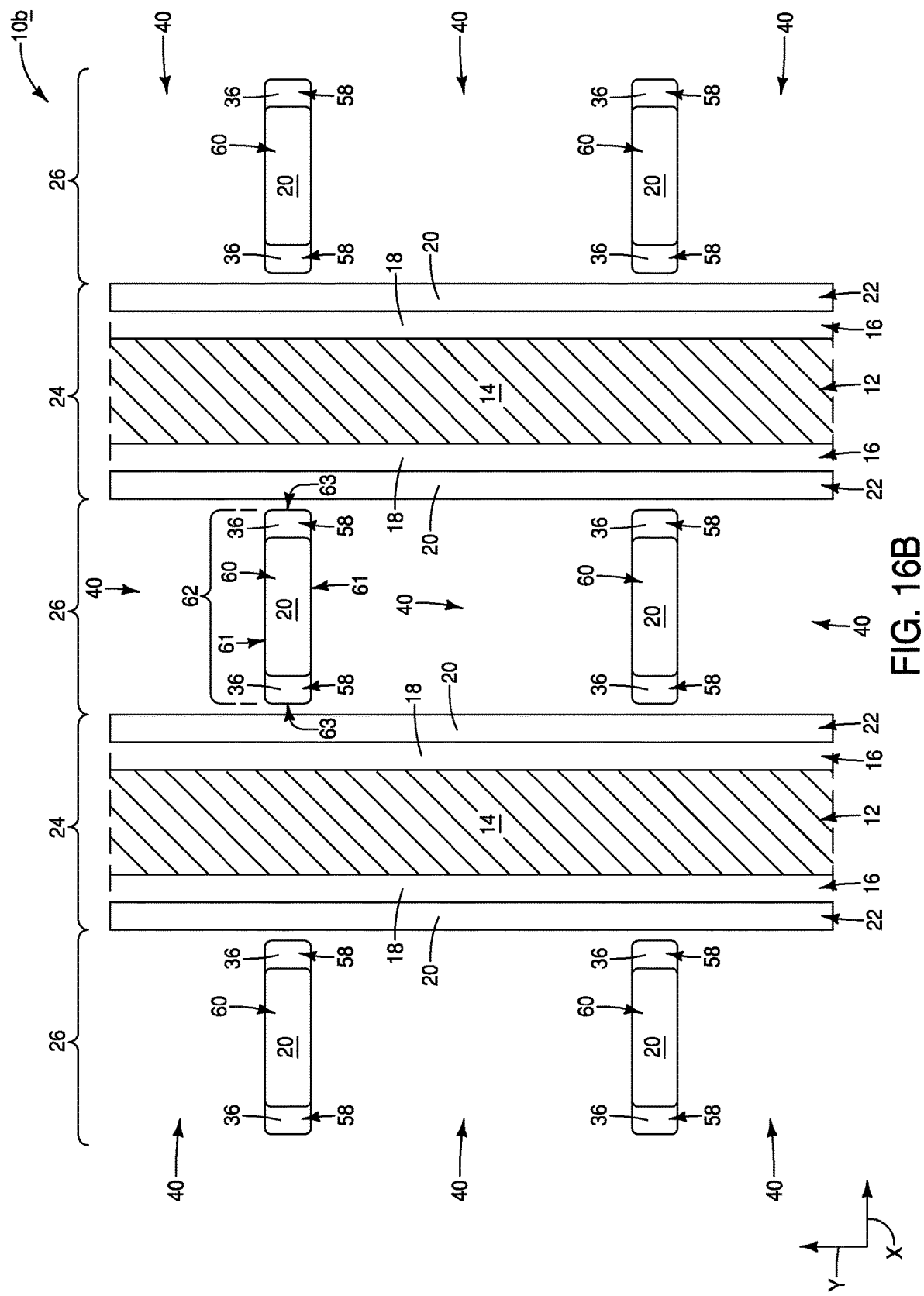

Referring to FIGS. 16A and 16B, an assembly 10b is shown at a process stage which may follow that of FIGS. 12A and 12B.

The embodiment of FIGS. 16A and 16B is similar to that of FIGS. 13A and 13B, except that the removal of some of the second silicon nitride composition 36 has removed the silicon nitride composition 36 from along the long surfaces 61 of the silicon nitride plugs 62. Accordingly, remaining regions of the liners 58 of the second silicon nitride composition 36 only partially surround the core regions 60 of the silicon nitride plugs 62.

Figure 17A:
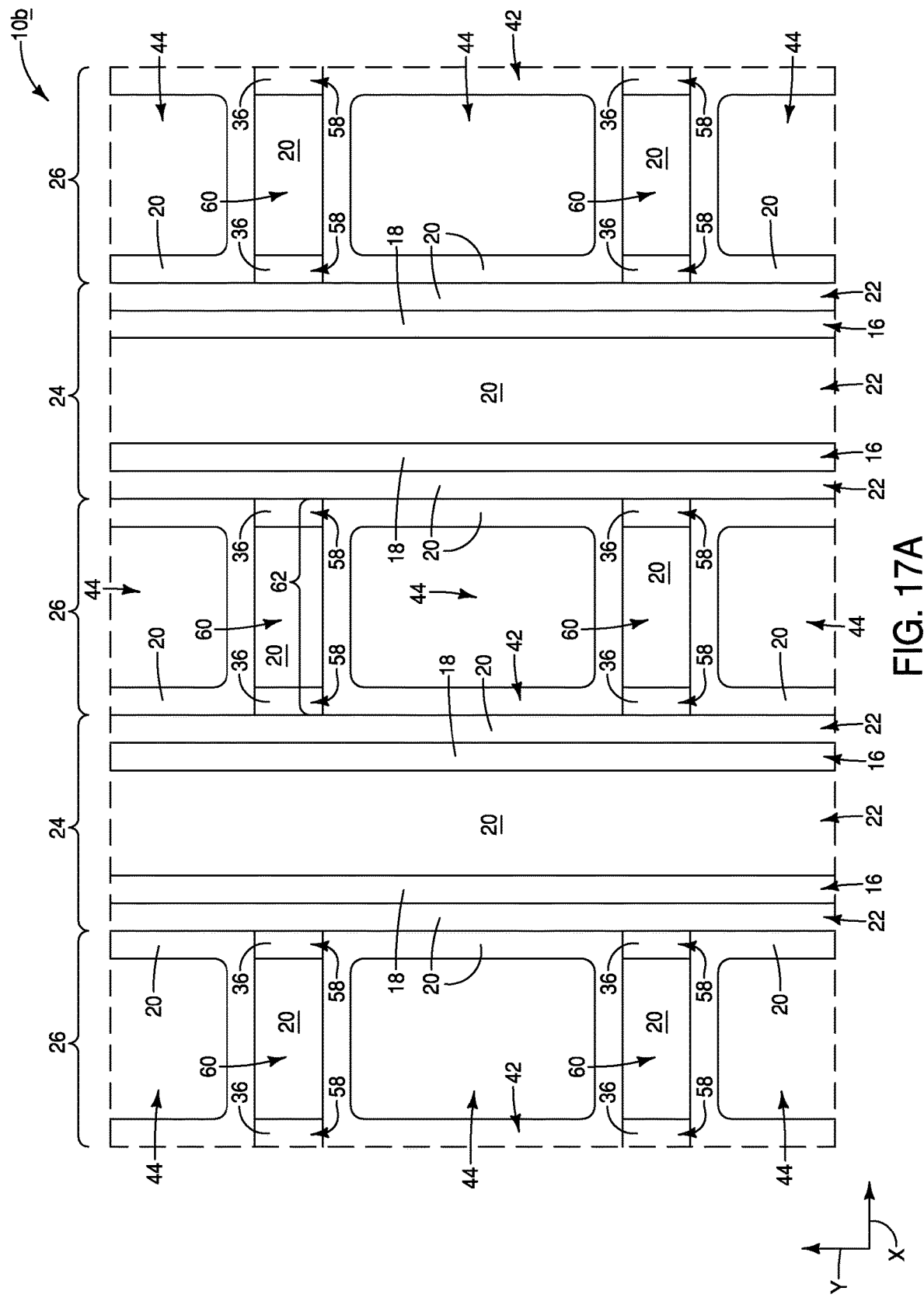
FIGS. 17A and 17B are diagrammatic cross-sectional top-down views along the lines A-A and B-B, respectively, of FIG. 1 at an example process stage which may follow that of FIGS. 16A and 16B.
Figure 17B:
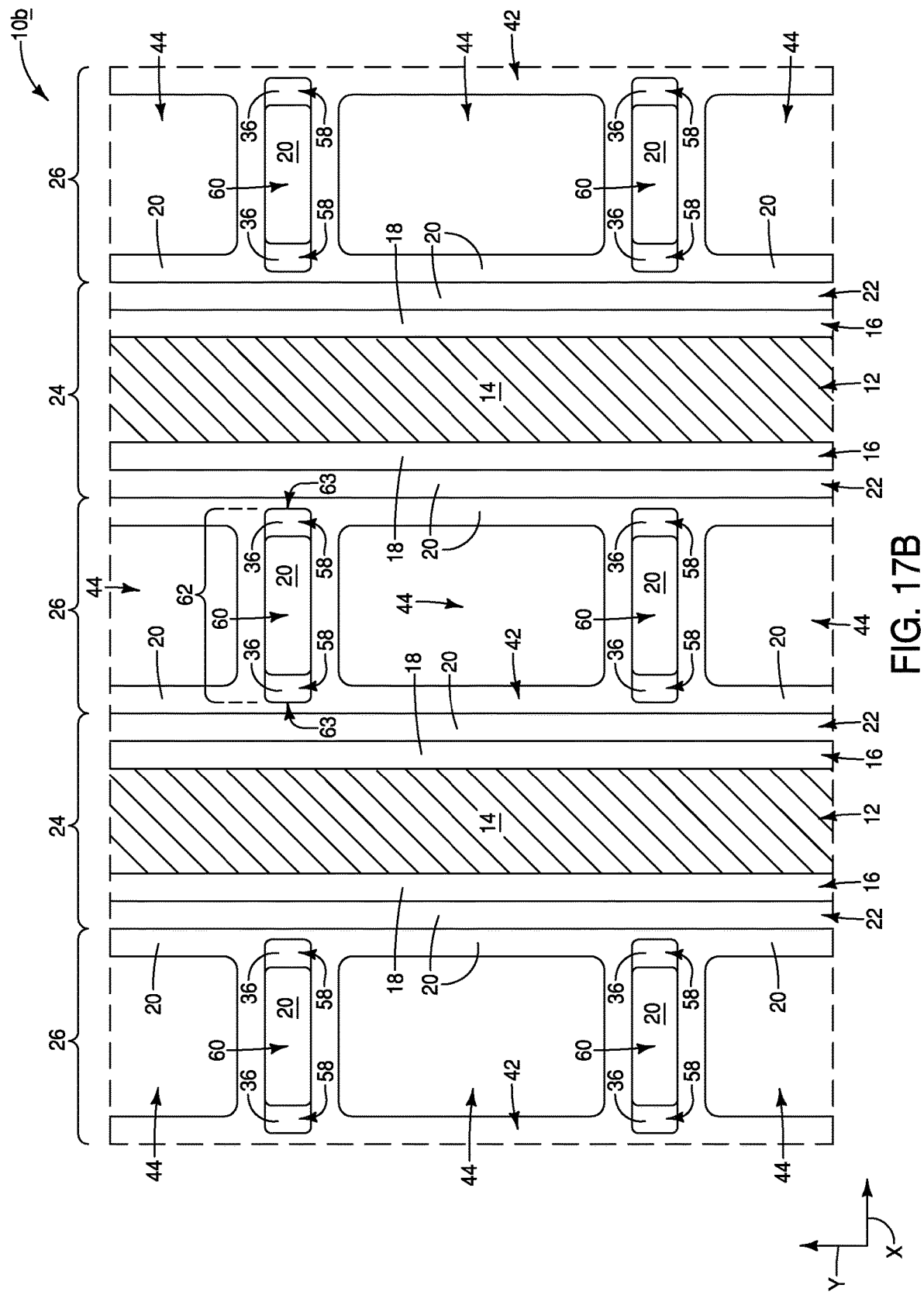

Referring to FIGS. 17A and 17B, the liners 42 are formed within the second openings 40 (FIGS. 16A and 16B). The liners 42 subdivide the second openings 40 (FIGS. 16A and 16B) into the contact holes 44.

Figure 18A:
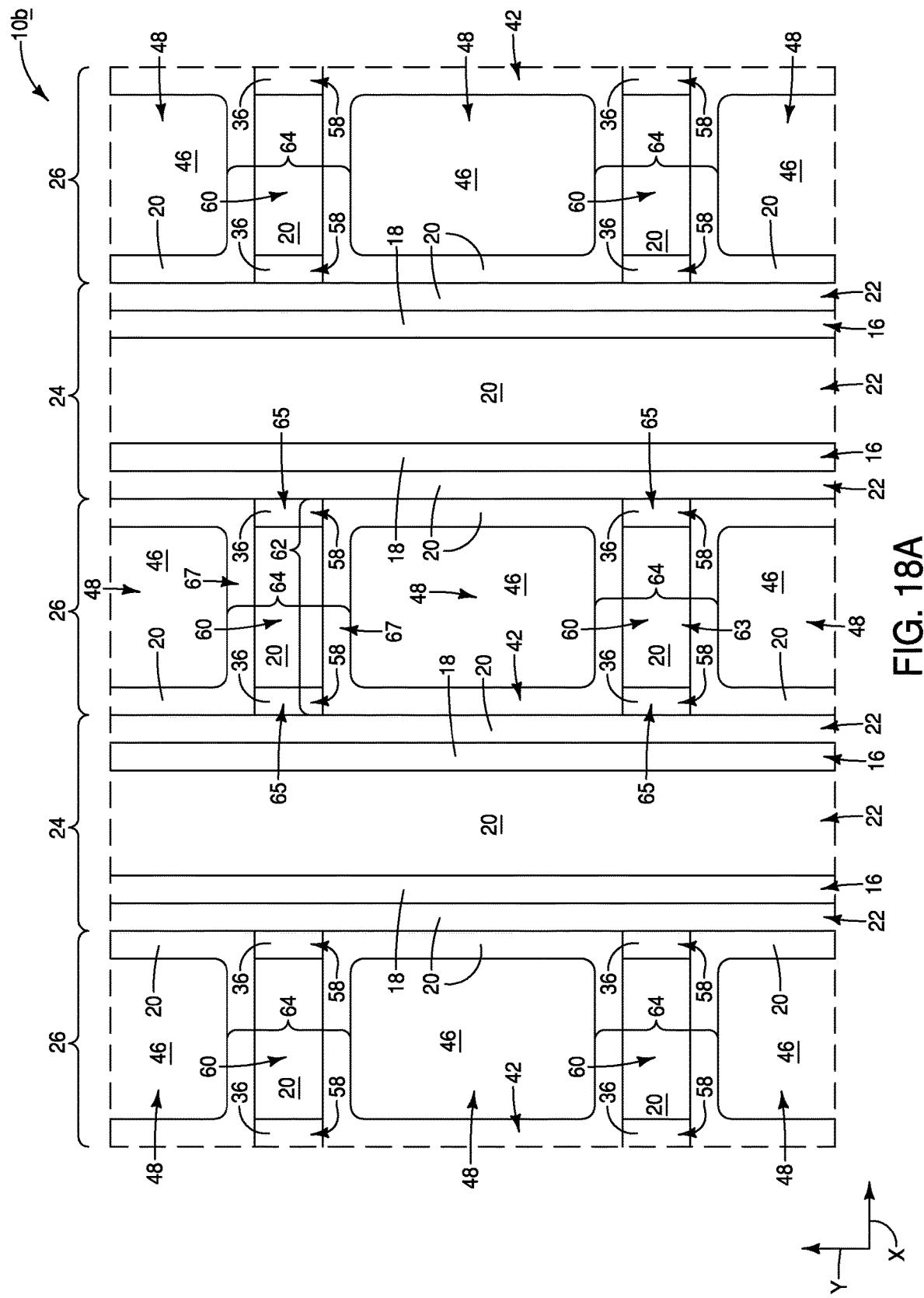
FIGS. 18A and 18B are diagrammatic cross-sectional top-down views along the lines A-A and B-B, respectively, of FIG. 1 at an example process stage which may follow that of FIGS. 17A and 17B.
Figure 18B:
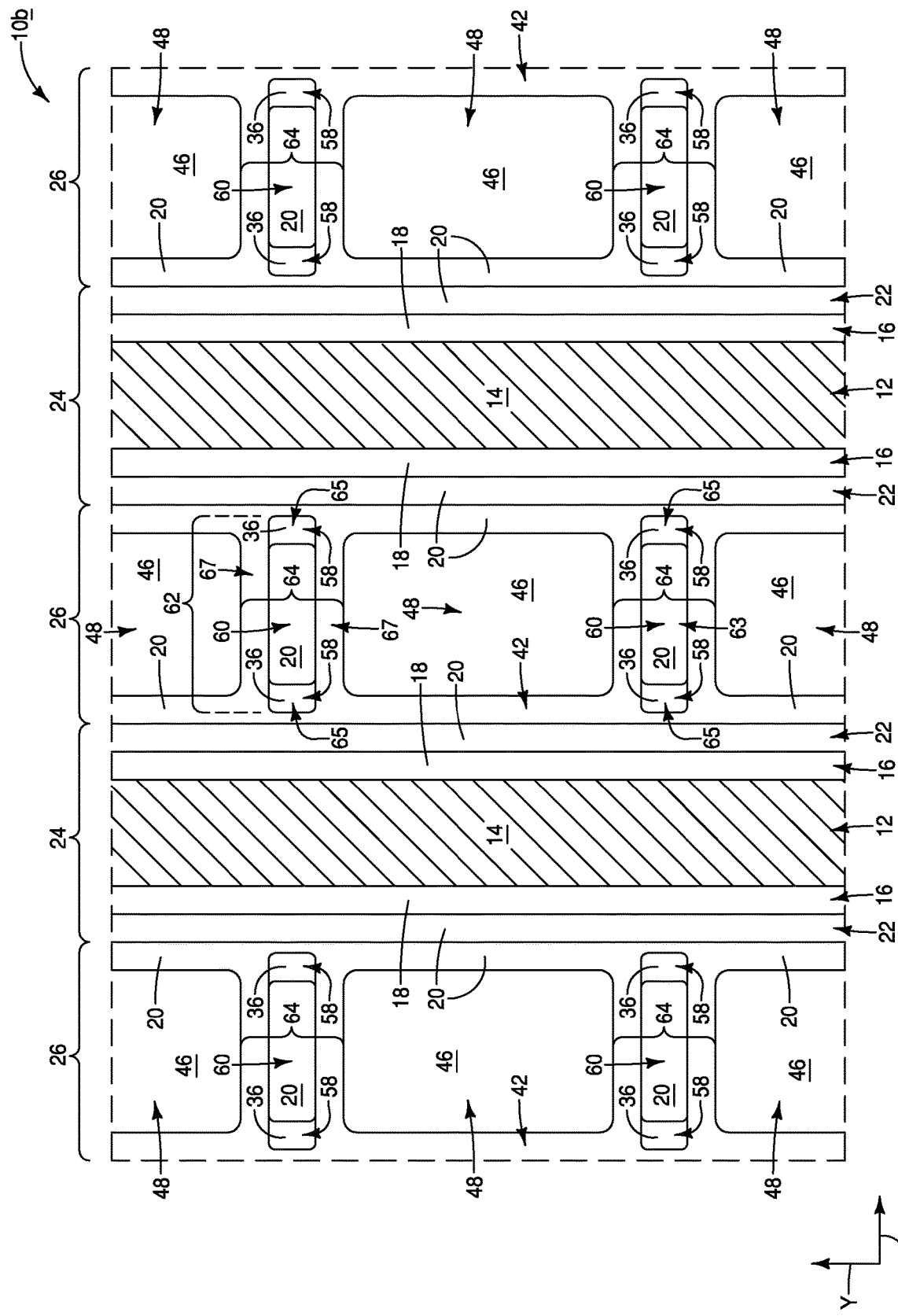

Referring to FIGS. 18A and 18B, the semiconductor material 46 is formed within the contact openings 44 (FIGS. 17A and 17B), and forms the contact regions 48.

The liners 42 and silicon nitride plugs 62 together to form insulative spacers 64 analogous to the spacers 64 described above with reference to FIGS. 15A and 15B. The contact regions 48 and the insulative spacers 64 are within the intervening regions 26; and alternate with one another along the y-axis direction (i.e., along the first direction).

The insulating spacers 64 comprise the first regions 63 of the first silicon nitride composition 20 together with second regions 65 of the second silicon nitride composition 36. In the shown embodiment of FIGS. 18A and 18B, the second regions 65 (i.e., the regions of the second silicon nitride composition 36) only partially surround the first regions 63 (i.e., the regions of the first silicon nitride composition 20). The liners 42 are comprised by third regions 67 of the spacers 64.

The conductive contact regions 48 of FIGS. 18A and 18B may be incorporated into memory cells 50 of the type described above with reference to FIG. 8. Such memory cells may be incorporated into a memory array 56 of the type described above with reference to FIG. 9.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly which has bitline structures that extend along a first direction. The bitline structures include conductive bitlines, and include insulative shells which extend over the conductive bitlines and along sidewalls of the conductive bitlines. The insulative shells include a first silicon nitride composition. The bitline structures are spaced from one another by intervening regions. Semiconductor structures and insulative spacers are within the intervening regions. The semiconductor structures and insulative spacers alternate with one another along the first direction. The insulative spacers include a second silicon nitride composition which is characterized as having a faster etch rate than the first silicon nitride composition by a mixture which contains sulfuric acid and hydrogen peroxide. Storage elements are coupled with the semiconductor structures. Access transistors are coupled with storage elements through the semiconductor structures. Conductive wordlines are coupled with gates of the access transistors. Each of the storage elements is uniquely addressed through a combination of one of the conductive bitlines and one of the conductive wordlines.

Some embodiments include an integrated assembly which has linear structures that extend along a first direction. The linear structures include conductive lines, and include insulative shells that extend over the conductive lines and along sidewalls of the conductive lines. The insulative shells include a first silicon nitride composition which consists of silicon and nitrogen. The linear structures are spaced from one another by intervening regions. Semiconductor structures and insulative spacers are within the intervening regions. The semiconductor structures and insulative spacers alternate with one another along the first direction. The insulative spacers comprise a second silicon nitride composition which includes silicon, nitrogen and boron.

Some embodiments include an integrated assembly having bitline structures which extend along a first direction. The bitline structures comprise conductive bitlines, and comprise insulative materials covering the conductive bitlines. The insulative materials comprise a first silicon nitride composition. The bitline structures are spaced from one another by intervening regions. Conductive materials and insulative spacers are within the intervening regions. The insulative spacers comprise a second silicon nitride composition characterized as having a faster etch rate than the first silicon nitride composition.

Some embodiments include a method of forming an integrated assembly. A construction is formed which includes bitline structures and silicon oxide between the bitline structures. The bitline structures extend along a first direction. The bitline structures comprise conductive bitlines, and comprise insulative shells which extend over the conductive bitlines and along sidewalls of the conductive bitlines. The insulative shells comprise a first silicon nitride composition. The bitline structures are spaced from one another by intervening regions. First openings are formed to extend into the silicon oxide. The first openings are within the intervening regions and are elongated along a second direction which crosses the first direction. A second silicon nitride composition is formed within the first openings. The silicon oxide is selectively removed relative to the first and second silicon nitride compositions to leave second openings which are laterally bounded by the first and second silicon nitride compositions. Some of the second silicon nitride composition is removed with an etch selective for the second silicon nitride composition relative to the first silicon nitride composition. Subsequently, semiconductor material is formed within the second openings.

Some embodiments include a method of forming an integrated assembly. A structure is formed which includes a plurality of bitline structures extending in a first direction in parallel to one another. Each of the bitline structures comprises a conductive bitline and a first silicon nitride composition covering the conductive bitline. The structure further includes insulating material between the bitline structures of the plurality of bitline structures. A plurality of insulating plugs is formed in the insulating material. Each of the insulating plugs comprises a second silicon nitride composition. The insulating material is selectively relative to the first and second silicon nitride compositions to form openings which are defined by the plurality of bitline structures and the plurality of insulating plugs. Some of the second silicon nitride composition is selectively relative to the first silicon nitride composition.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
   bitline structures extending along a first direction; the bitline structures comprising conductive bitlines, and comprising insulative materials covering the conductive bitlines; the insulative materials comprising a first silicon nitride composition; the bitline structures being spaced from one another by intervening regions;
   conductive materials and insulative spacers within the intervening regions; the insulative spacers comprising a second silicon nitride composition characterized as having a faster etch rate than the first silicon nitride composition;
   storage elements coupled with the semiconductor structures;
   access transistors coupled with storage elements through the semiconductor structures; and
   conductive wordlines coupled with gates of the access transistors; each of the storage elements being uniquely addressed through a combination of one of the conductive bitlines and one of the conductive wordlines.

2. The integrated assembly of claim 1, wherein the second silicon nitride composition is characterized as having a faster etch rate than the first silicon nitride composition by a mixture comprising sulfuric acid and hydrogen peroxide.

3. The integrated assembly of claim 1, wherein the second silicon nitride composition contains boron therein and the first silicon nitride composition is free from containing boron therein.

4. The integrated assembly of claim 1 wherein as the insulative spacers extend within the intervening regions, the configuration of the insulative spacers tapers.

5. The integrated assembly of claim 1, wherein the second silicon nitride composition is lower in density than the first silicon nitride composition.

6. An integrated assembly, comprising:
- linear structures extending along a first direction; the linear structures comprising conductive lines, and comprising insulative shells extending over the conductive lines and along sidewalls of the conductive lines; the insulative shells comprising a first silicon nitride composition which consists of silicon and nitrogen; the linear structures being spaced from one another by intervening regions;
- semiconductor structures and insulative spacers within the intervening regions; the semiconductor structures and the insulative spacers alternating with one another along the first direction; the insulative spacers comprising a second silicon nitride composition which includes silicon, nitrogen and boron;
- storage elements coupled with the semiconductor structures;
- access transistors coupled with storage elements through the semiconductor structures; and
- conductive wordlines coupled with gates of the access transistors; each of the storage elements being uniquely addressed through a combination of one of the conductive bitlines and one of the conductive wordlines.

7. The integrated assembly of claim 6 wherein as the insulative spacers extend within the intervening regions, the configuration of the insulative spacers tapers.

8. The integrated assembly of claim 6 wherein the semiconductor structures comprise conductively-doped silicon.

9. The integrated assembly of claim 8 further comprising capacitors coupled with the semiconductor structures.

10. The integrated assembly of claim 6 wherein each of the insulative spacers includes a second region of the second silicon nitride composition in combination with a first region of the first silicon nitride composition.

11. The integrated assembly of claim 6 wherein the boron is present in the second silicon nitride composition to a concentration within a range of from about 20 atomic percent to about 30 atomic percent.

12. The integrated assembly of claim 10 wherein the second regions only partially surround lateral peripheries of the first regions.

13. The integrated assembly of claim 10 wherein the second regions entirely surround lateral peripheries of the first regions.

14. The integrated assembly of claim 10 wherein the second regions extend at least partially around the first regions.

15. The integrated assembly of claim 10 wherein the first regions extend at least partially around the second regions.

16. An integrated assembly, comprising:
- bitline structures extending along a first direction; the bitline structures comprising conductive bitlines, and comprising insulative shells extending over the conductive bitlines and along sidewalls of the conductive bitlines; the insulative shells comprising a first silicon nitride composition; the bitline structures being spaced from one another by intervening regions;
- semiconductor structures and insulative spacers within the intervening regions; the semiconductor structures and the insulative spacers alternating with one another along the first direction; the insulative spacers comprising a second silicon nitride composition characterized as having a faster etch rate than the first silicon nitride composition by a mixture comprising sulfuric acid and hydrogen peroxide;
- storage elements coupled with the semiconductor structures;
- access transistors coupled with storage elements through the semiconductor structures; and
- conductive wordlines coupled with gates of the access transistors; each of the storage elements being uniquely addressed through a combination of one of the conductive bitlines and one of the conductive wordlines.

17. The integrated assembly of claim 16 wherein the first silicon nitride composition consists of silicon nitride, and wherein the second silicon nitride composition comprises silicon, nitrogen and boron.

18. The integrated assembly of claim 17 wherein the boron is present in the second silicon nitride composition to a concentration within a range of from about 20 atomic percent to about 30 atomic percent.

19. The integrated assembly of claim 16 wherein the first silicon nitride composition has a higher density than the second silicon nitride composition.

20. The integrated assembly of claim 19 formed by a process in which the first silicon nitride composition is deposited at a temperature of at least about 600° C. and the second silicon nitride composition is deposited at a temperature of no greater than about 500° C.

21. The integrated assembly of claim 16 wherein each of the insulative spacers includes a second region of the second silicon nitride composition in combination with a first region of the first silicon nitride composition.

22. The integrated assembly of claim 21 wherein the second regions extend at least partially around the first regions; and wherein each of the insulative spacers includes a third region of the first silicon nitride composition which at least partially surrounds the second region.

23. The integrated assembly of claim 16 wherein as the insulative spacers extend within the intervening regions, the configuration of the insulative spacers tapers.

24. The integrated assembly of claim 21 wherein the second silicon nitride composition of the insulative spacers is configured as a hollow ring.

25. The integrated assembly of claim 21 wherein the second silicon nitride composition of the insulative spacers is configured as a solid core.

26. The integrated assembly of claim 16 wherein the insulative shells are against the sidewalls of the conductive bitlines.

27. The integrated assembly of claim 16 wherein the insulative shells comprise a single-uninterrupted physical structure.

28. The integrated assembly of claim 21 wherein the second regions only partially surround lateral peripheries of the first regions.

29. The integrated assembly of claim 21 wherein the second regions entirely surround lateral peripheries of the first regions.

30. The integrated assembly of claim 21 wherein the second regions extend at least partially around the first regions.

31. The integrated assembly of claim 21 wherein the first regions extend at least partially around the second regions.

* * * * *